US012776042B2

(12) United States Patent
Wald

(10) Patent No.: US 12,776,042 B2
(45) Date of Patent: Oct. 27, 2026

(54) PARTITIONING ELEMENTS USING SPATIAL INDEXING FOR LIGHT TRANSPORT SIMULATION IN MULTI-DIMENSIONAL SPACE

(71) Applicant: NVIDIA Corporation, Santa Clara, CA (US)

(72) Inventor: Ingo Wald, Salt Lake City, UT (US)

(73) Assignee: NVIDIA Corporation, Santa Clara, CA (US)

( * ) Notice: Subject to any disclaimer, the term of this patent is extended or adjusted under 35 U.S.C. 154(b) by 177 days.

(21) Appl. No.: 18/618,746

(22) Filed: Mar. 27, 2024

(65) Prior Publication Data

US 2025/0308030 A1 Oct. 2, 2025

(51) Int. Cl.

*G06T 7/11* (2017.01)
*G06F 30/27* (2020.01)
*G06T 9/00* (2006.01)

(52) U.S. Cl.

CPC ................ *G06T 7/11* (2017.01); *G06F 30/27* (2020.01); *G06T 9/00* (2013.01)

(58) Field of Classification Search

CPC .............. G06T 7/11; G06T 9/00; G06F 30/27
USPC .......................................................... 345/506
See application file for complete search history.

(56) References Cited

U.S. PATENT DOCUMENTS 9,990,758 B2 * 6/2018 Ganestam ............ G06T 15/005
2012/0313944 A1 * 12/2012 Kontkanen .......... G06T 15/506
345/426
2013/0235031 A1 9/2013 Karras
2013/0235050 A1 9/2013 Karras
2016/0048999 A1 2/2016 Patney et al.
2020/0051314 A1 2/2020 Laine et al.
2020/0302676 A1 9/2020 Laine et al.
2025/0259384 A1 * 8/2025 Wald ...................... G06T 15/06

OTHER PUBLICATIONS

Lauterbach, et al.; "Fast BVH Construction on GPUs", Journal Compilation 2008 the Eurographics Association and Blackwell Publishing Ltd., vol. 28, No. 2, 10 pgs.

Pantaleoni, et al.; "HLBVH: Hierarchical LBVH Construction for Real-Time Ray Tracing of Dynamic Geometry," High Performance Graphics (2010), 9 pgs.

* cited by examiner

*Primary Examiner* — Thomas J Lett
(74) *Attorney, Agent, or Firm* — IRON SUMMIT IP LLP

(57) ABSTRACT

In various examples, based on spatial index values corresponding to first assignments of a first set of bins to spatial elements of a space, second assignments may be determined of a second set of bins to at least two spatial elements. The second assignments may at least partially overwrite corresponding assignments of the first assignments and may be used to determine partitions of the at least two spatial elements. The second assignments may be determined based on the first assignments indicating multiple spatial elements correspond to a same subregion of the space. The first assignments may be used to determine a first portion of a partitioning of the spatial elements. The second assignments may be used to partition a subset of the spatial elements to determine a second portion of the partitioning of the spatial elements, which may further partition one or more nodes from the first portion.

20 Claims, 17 Drawing Sheets

PARTITIONING ELEMENTS USING SPATIAL INDEXING FOR LIGHT TRANSPORT SIMULATION IN MULTI-DIMENSIONAL SPACE

BACKGROUND

Morton codes may be mapped to data points from a multidimensional space while preserving spatial relationships between the data points. For example, binary representations of coordinates corresponding to the data points in the multidimensional space (e.g., cells that contain the data points) may be interleaved to result in Morton codes for corresponding data points which indicate the spatial relationships. Morton codes may be used to efficiently build a Bounding Volume Hierarchy (BVH) using spatial elements of a scene as the data points. The BVH may then be used to accelerate ray intersection testing with geometry for light transport simulation within the scene. A typical approach to constructing a BVH assigns bins to the spatial elements of the scene using Morton codes. The Morton code assignments for spatial elements of a node of the BVH are used to determine split planes that group nearby spatial elements into one or more child nodes of the BVH. This process may be recursively performed until one or more leaf nodes of the BVH are generated.

Typically, when constructing a BVH, the number of bits used to represent the Morton codes can limit the granularity of the regions encoded in the BVH. For example, some spatial elements may be assigned the same Morton code resulting in a potentially large number of spatial elements being assigned to the same leaf node-impacting the ability of the BVH to accelerate ray intersection testing for corresponding regions of the scene. While the number of bits used to represent Morton codes may be increased to reduce or eliminate redundant assignments, this increases the memory consumption and bandwidth needed to construct the BVH. Additionally, the Morton codes may be sorted to determine the split planes and some systems may be capable of performing faster sorting for values of particular bit lengths, such as 32-bits. Thus, using additional bits to represent Morton codes may cause the Morton codes to be sorted in a significantly less efficient manner.

SUMMARY

Embodiments of the present disclosure relate to multi-dimensional binning for hierarchical partitioning. Systems and methods are disclosed that may be used to further partition spatial elements of a scene when a limited number of bits are used to represent Morton codes or other spatial index values.

In contrast to conventional systems, such as those described above, spatial elements may be assigned (e.g., via a second assignment) to a (second) set of bins based at least on spatial index values corresponding to (first) assignments between the spatial elements with a first set of bins. The (second) assignments may then be used to determine one or more partitions of the at least two spatial elements for a partitioning of the spatial elements of the space. The second assignments may be determined and used to perform partitioning based on various potential criteria, such as based at least on the first assignments indicating multiple spatial elements correspond to a same subregion of the space, such as a same bin of the first set of bins and/or based at least on the first assignments including at least two spatial elements assigned to a same spatial index value.

In at least one embodiment, the spatial elements are partitioned according to the first assignments to determine a first portion of a hierarchical partitioning of the spatial elements. A subset of the spatial elements are partitioned according to the second assignments to determine a second portion of the hierarchical partitioning of the spatial elements, further, one or more nodes may be partitioned from the first portion using the second set of bins. Spatial elements may be partitioned according to the second assignments (e.g., to the second set of bins) using the same or a similar approach as used with the first assignments to the first set of bins, or a different approach may be used. In at least one embodiment, the second assignments to the second set of bins for spatial elements at least partially overwrites corresponding assignments of the first assignments to the first set of bins. For example, a range of the first assignments for the spatial elements in a sorted list may be overwritten. The range may then be sorted and used to determine one or more split planes indicating one or more partitions of the spatial elements.

BRIEF DESCRIPTION OF THE DRAWINGS

The present systems and methods for enhanced binning using spatial indexing for partitioning spatial elements are described in detail below with reference to the attached drawing figures, wherein.

DETAILED DESCRIPTION

Figure 1:
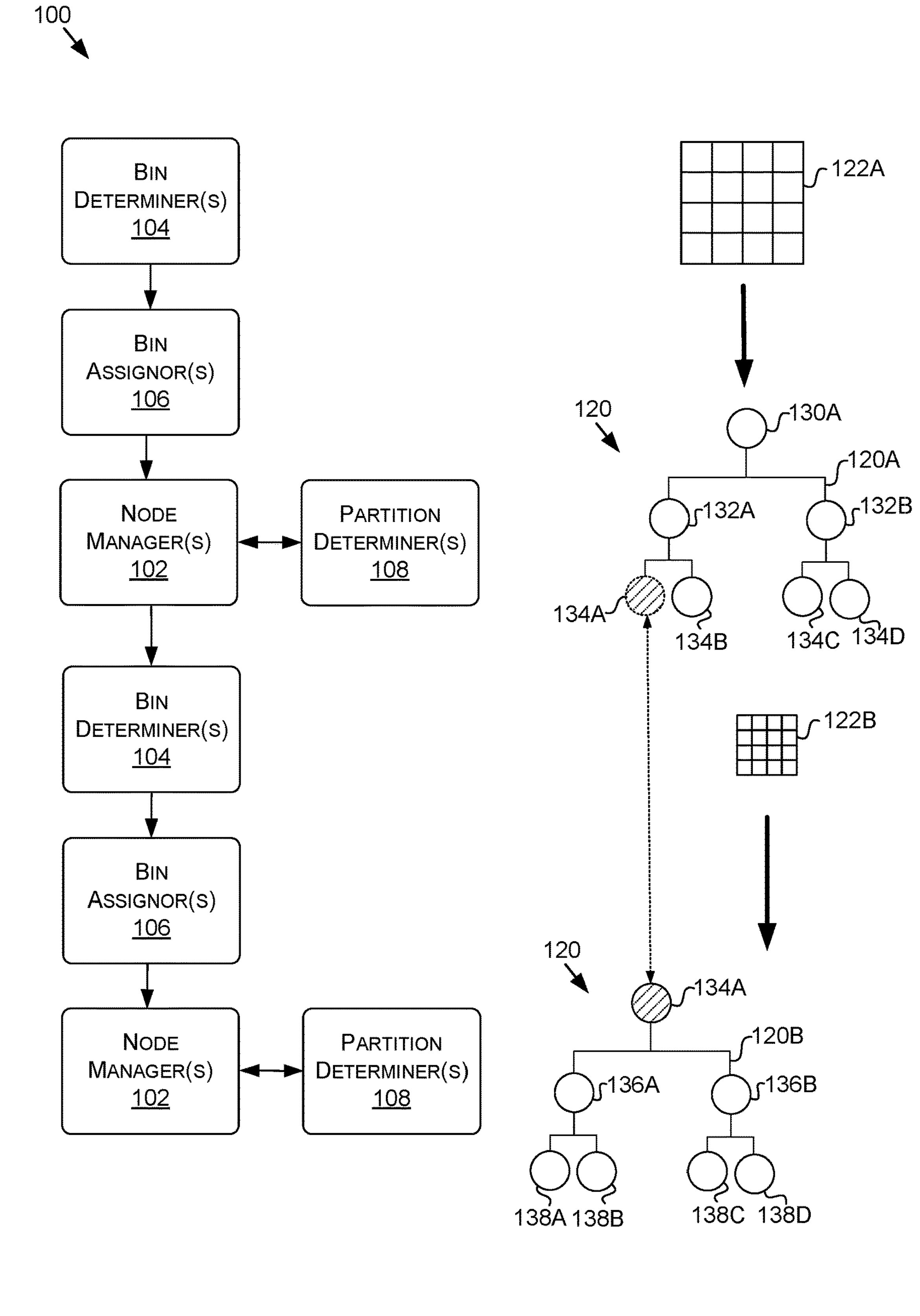
FIG. 1 is an example of a process for determining a partitioning of spatial elements using spatial indexing, in accordance with some embodiments of the present disclosure.

Systems and methods are disclosed related to multi-dimensional binning for hierarchical partitioning of elements for accelerating processing, such as light transport simulation. Systems and methods are disclosed that may be used to further partition spatial elements of a scene when a limited number of bits are used to represent Morton code or other spatial index values.

In accordance with disclosed approaches, based at least on (e.g., spatial) index values corresponding to first assignments of a first set of bins to (e.g., spatial) elements of a space, second assignments may be determined of a second set of bins to at least two of the elements. The second assignments may then be used to determine one or more partitions of the at least two elements for a partitioning of the elements of the space. Thus, the at least two elements may be partitioned even where the first set of bins are not sufficiently granular to indicate the one or more partitions for the at least two elements. For example, the at least two elements may be partitioned even where the bit length of the index values is insufficient to assign the at least two element to separate bins.

The assignments to the second set of bins may be determined and used to perform partitioning based on various potential criteria. For example, the assignments to the second set of bins may be determined based at least on a quantity of elements in a subset(s) of the elements being partitioned, based at least on the first assignments indicating the subset corresponds to a same subregion of the space, such as a same bin(s) of the first set of bins, based at least on the first assignments including at least two elements assigned to a same index value, based at least on one or more dimensions and/or a size or density of a region(s) of the space that corresponds to the subset(s), based at least on identifying a leaf node indicated by the first assignments includes multiple elements, based at least on a bit length and/or quantity of bits used to represent the index values and/or a number of bits consumed (e.g., all of the bits) in evaluating the index values for partitioning using the first assignments, based at least on one or more of memory or computational resources available and/or allocated to the system and/or the construction of the partitioning, etc.

In at least one embodiment, the first assignments may be used to partition the elements to determine a first portion of a hierarchical partitioning of the elements. The second assignments may be used to partition a subset of the elements to determine a second portion of the hierarchical partitioning of the elements, which may further partition one or more nodes from the first portion using the second set of bins. In at least one embodiment, a Z-order encoding of the elements is made using the index values (e.g., Morton codes) to determine the first assignments. The index values of the first assignments may be sorted into a list that indicates a space-filling curve (e.g., a Morton curve). Bit differences in the list may indicate one or more split planes and may be detected to identify elements (e.g., corresponding to ranges from the list) for partitions (e.g., child nodes). The process may be repeated for a partition using a portion of the list that corresponds to the elements of the partition until some end condition it met, such as where all of the elements are assigned the same index value, there is only one element in the partition, etc. In examples where the elements are assigned the same index value, second assignments to the second set of bins may be determined and/or used to further partition the corresponding elements.

The second assignments to the second set of bins may be used to partition elements using the same or a similar approach as used with the first assignments to the first set of bins, or a different approach may be used. In at least one embodiment, the second assignments to the second set of bins for elements at least partially overwrites corresponding assignments of the first assignments to the first set of bins. For example, a range of the first assignments for the elements in the sorted list may be overwritten. The range may then be sorted and used to determine one or more split planes similar to the initial list.

Disclosed embodiments may be comprised in a variety of different systems such as automotive systems (e.g., a control system for an autonomous or semi-autonomous machine, a perception system for an autonomous or semi-autonomous machine), systems implemented using a robot, aerial systems, medial systems, boating systems, smart area monitoring systems, systems for performing deep learning operations, systems for performing simulation operations, systems for performing digital twin operations, systems implemented using an edge device, systems incorporating one or more virtual machines (VMs), systems for performing synthetic data generation operations, systems implemented at least partially in a data center, systems for performing conversational AI operations, systems for performing light transport simulation, systems for performing collaborative content creation for 3D assets, systems implemented at least partially using cloud computing resources, systems for performing generative AI operations, systems for performing operations using a large language model, and/or other types of systems.

With reference to FIG. 1, FIG. 1 is an example of a process for determining a partitioning of spatial elements using spatial indexing, in accordance with some embodiments of the present disclosure. It should be understood that this and other arrangements described herein are set forth only as examples. Other arrangements and elements (e.g., machines, interfaces, functions, orders, groupings of functions, etc.) may be used in addition to or instead of those shown, and some elements may be omitted altogether. Further, many of the elements described herein are functional entities that may be implemented as discrete or distributed components or in conjunction with other components, and in any suitable combination and location. Various functions described herein as being performed by entities may be carried out by hardware, firmware, and/or software. For instance, various functions may be carried out by a processor executing instructions stored in memory. In at least one embodiment, the systems, methods, and processes described herein may be executed using similar components, features, and/or functionality to those of the parallel processing unit 600 of FIG. 6, the general processing clusters 650 of FIG. 7A, the memory partition unit 680 of FIG. 7B, the streaming multiprocessor 740 of FIG. 8A, the processing system 800 of FIG. 8B, the system 865 of FIG. 8C, the computing device 1200 of FIG. 12, and/or the data center 1300 of FIG. 13.

The process 100 may be implemented using, amongst additional or alternative components, one or more node managers 102, one or more bin determiners 104, one or more bin assignors 106, or one or more partition determiners 108.

As an overview, the node manager 102 may be configured to manage nodes of a partitioning of a space (e.g., a hierarchical partitioning of a scene), such as a partitioning 120, which may include modifying, creating, and/or deleting one or more nodes. The bin determiner 104 may be configured to determine and/or generate multi-dimensional bins that correspond to a spatial partitioning of the space, such as bins 122A or bins 122B. The bin assignor 106 may be configured to assign one or more spatial elements to one or more of the multi-dimensional bins, such as a spatial element 224A, a spatial element 224B, a spatial element 224C, a spatial element 224D, a spatial element 224E, a spatial element 224F, or a spatial element 224G of FIG. 2 (also referred to as "spatial elements 224"), for example, using spatial index values (e.g., the Morton codes shown in FIG. 2). The partition determiner 108 may be configured to determine one or more partitions of the spatial elements based at least on one or more assignments between the one or more spatial elements and the one or more bins determined using the bin assignor 106. The node manager 102 may be configured to assign at least one of the spatial elements to a node of the partitioning or otherwise update or generate the partitioning based at least on the one or more partitions determined using the partition determiner 108. In at least one embodiment, the process 100 is implemented using a recursive process for determining the partitioning 120. The recursive process may include recursively partitioning spatial elements of a node to determine child nodes for the partitioning 120 until a leaf node is determined and/or an end condition it satisfied for the recursion.

In various embodiments, the spatial elements may be assigned to multiple sets of bins, for example, to allow for a finer granularity in the partitioning 120 when a given number of bits are used to represent the spatial index values. For example, the node manager 102 may use assignments of the spatial elements 224 to the bins 122A that are recorded using the spatial index values to determine a portion 120A of the partitioning 120. The node manager 102 may further evaluate one or more criteria corresponding to the spatial elements 224 that are assigned to the bins 122A. In at least one embodiment, the one or more criteria correspond to a quantity of spatial elements assigned to a same bin, a same partition, a same leaf node, and/or a same spatial index value. Based at least on the one or more criteria being satisfied, the node manager 102 may use the bin determiner 104 and the bin assignor 106 to assign (e.g., re-assign) one or more subsets of the spatial elements 224 to one or more other sets of bins, such as the bins 122B (e.g., using one or more of the spatial index values used for assigning the bins 122A). The node manager 102 may use the assignments to the other set(s) of bins to partition the subset(s) of spatial elements, for example, to determine a portion 120B of the partitioning 120. Thus, the subset(s) of spatial elements may be further partitioned even where the bit length used to represent the spatial index values is otherwise too short to allow for partitioning using the assignments to the bins 122A alone.

A partitioning determined using the process 100 may be used to render an image of a scene using any of a variety of rending techniques. For example, the partitioning 120 may be used to perform any of a variety of light transport simulation operations on graphical data, such as path tracing, ray tracing, ray marching, etc. By way of example, and not limitation, the hierarchical partitioning may correspond to the acceleration structure 1100 of FIG. 11 and may be used in the ray tracing pipeline 1000 of FIG. 10.

In at least one embodiment, the hierarchical partitioning, such as the partitioning 120, includes a Bounding Volume Hierarchy (BVH). However, the process 100 may be used to determine other types of partitionings of spatial elements. Examples of the spatial elements include one or more primitives, spheres, cubes, triangles, quadrilaterals, tetrahedra, points, lines, curves, polylines, polygons, parametric shapes, polyhedrons, volumetric regions, surfaces, meshes, models, points of a point cloud, voxels, particles, Bezier patches, Non-Uniform Rational B-Spline (NURB) surfaces, implicit surfaces, fractal shapes, textured surfaces, and/or parametric surfaces. However, the partitioning 120 may include other types of data structures and/or may be used to partition other types of data. As various examples, the partitioning 120 may include one or more of an r-tree, a k-d tree, a geohash, a grid index, or a spatial hashing. Further examples of data types for the spatial elements include N-dimensional points, geographic data (e.g., geographic features, geographic coordinates or objects), sensor data (e.g., sensor readings), biological data, database data (e.g., entries, records, or elements), vector data, etc. For example, disclosed hierarchical partitionings may be used to accelerate database operations (e.g., data access) for spatially indexed data elements. While a scene is primarily described herein, the scene may also refer to a space which includes the spatial elements.

Figure 2:
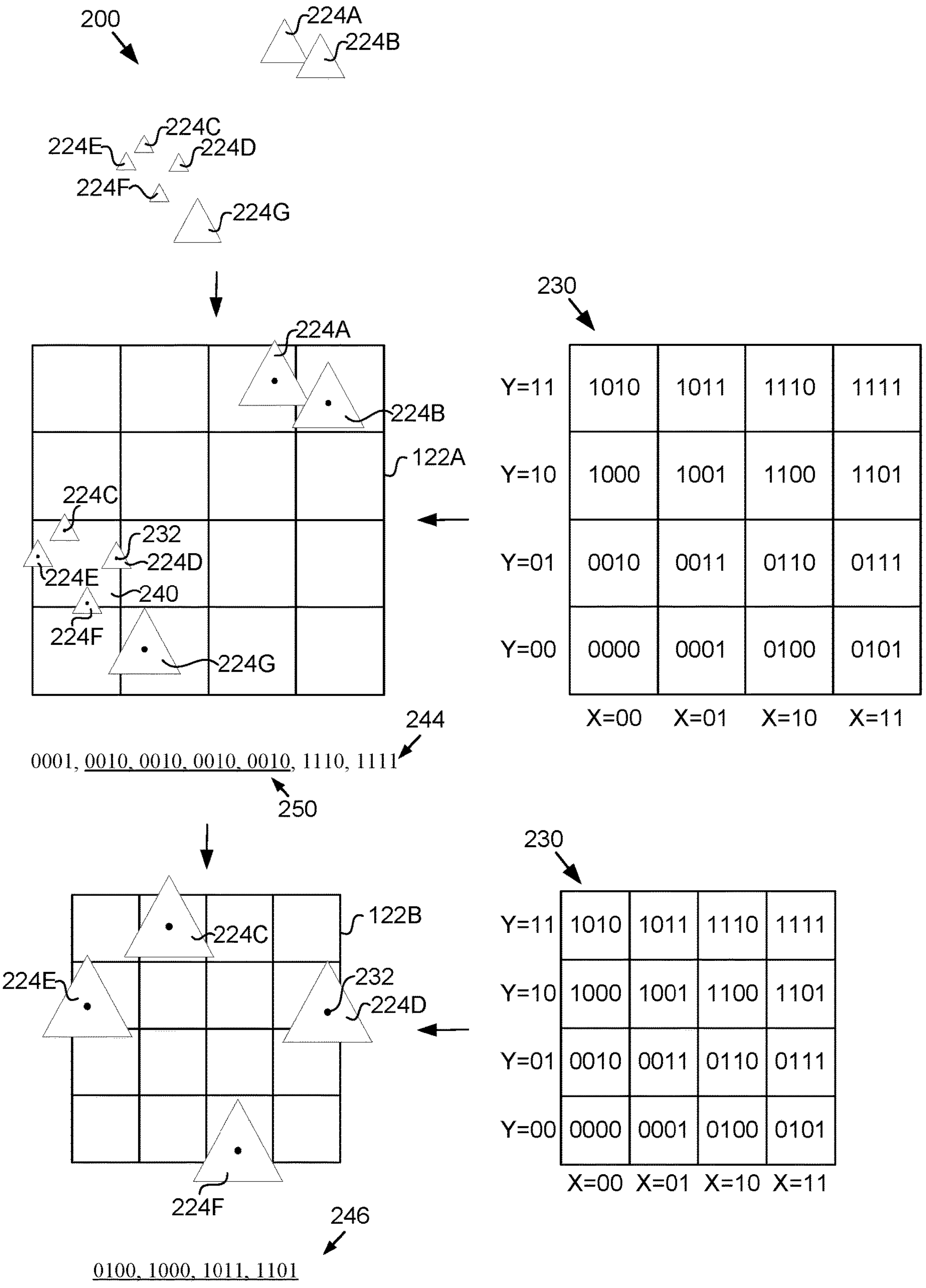
FIG. 2 is an example of a diagram illustrating assigning spatial index values to sets of bins corresponding to the spatial index values, in accordance with some embodiments of the present disclosure.

As described herein, the node manager 102 may be configured to manage nodes of the partitioning 120 of a space, such as a scene 200 of FIG. 2, which may include modifying, creating, and/or deleting one or more nodes. For example, the partitioning 120 may include the portion 120A and the portion 120B. The portion 120A includes a node 130A, a node 132A, a node 132B, a node 134A, a node 134B, a node 134C, and a node 134D. The portion 120B includes a node 136A, a node 136B, a node 138A, a node 138B, a node 138C, and a node 138D in a sub-tree corresponding to the node 134A of the portion 120A. The partitioning 120 is provided as an example and may have different forms (e.g., topologies) depending upon the partitioning approach implemented using the node manager 102. Further, the disclosure focuses on a top-down approach to determining the partitioning 120, however, bottom-up or hybrid approaches may be used.

To determine the partitioning 120, the process 100 may include, for example, the bin determiner(s) 104 determining and/or generating multi-dimensional bins that correspond to a spatial partitioning of the space, such as the bins 122A and/or the bins 122B. The bin determiner(s) 104 may determine one or more sets of bins (e.g., a size(s), location(s), and/or resolution(s) of the bins 112A and/or 112B) using a variety of potential approaches or criterion.

In at least one embodiment, the bin determiner(s) 104 determines the set(s) of bins based at least on one or more properties of the data to be partitioned. For example, referring to FIG. 2, FIG. 2 is an example of a diagram illustrating assigning spatial index values to sets of bins corresponding to the spatial index values, in accordance with some embodiments of the present disclosure. The bin determiner(s) 104 may determine the bins 122A and/or the bins 112B based at least on analyzing one or more properties of one or more of the spatial elements 224 in the scene 200 that are to be partitioned using the bins 122A and/or the bins 112B. Examples of the properties include, for example, any combination of the quantity of the spatial elements to be partitioned, a spatial density of the spatial elements to be partitioned, a spatial extent of the spatial elements to be partitioned, and/or a distribution of the spatial elements to be partitioned. Larger quantities of the spatial elements may result in the bin determiner(s) 104 using smaller bins for more a granular partitioning. Spatial density may be considered to adapt the bin size based on areas with varying concentrations of spatial elements (e.g., bin sizes may vary within the same set of bins and/or across sets of bins based on varying spatial density). The spatial extent of the spatial elements to be partitioned may be used to define the overall scale of the set(s) of bins or grid(s).

In at least one embodiment, the bin determiner(s) 104 determines the set(s) of bins based at least on a number of bits (e.g., a target number of bits) and/or one or more memory criteria (e.g., a memory size, a storage size) used to represent or store spatial index values used for assigning the spatial elements 224 to the set(s) of bins. For example, higher memory resources (e.g., a larger number of bits) may allow for higher precision in the spatial indexing (e.g., more bins or a higher resolution grid). However, a smaller number of bits may increase memory and computational efficiency in determining partitions of the spatial elements using the bins. In at least one embodiment, the number of bits (or bit length) may correspond to a sorting algorithm used by the partition determiner 108 to determine one or more partitions of the spatial elements using the spatial index values. For example, a sorting algorithm, such as Radix sort, may be configured to quickly sort values of particular bit lengths, such as 32-bits. By considering the number of bits, the bin determiner(s) 104 may favor or limit the number of bins in a set of bins based at least on a particular number of bits available for the spatial index values.

In at least one embodiment, the bin determiner(s) 104 determines the set(s) of bins based at least on a number of dimensions for the bins in the set(s) of bins. For example, a larger bit length may be used for representing spatial index values for a higher number of dimensions. By way of example, and not limitation, for 64-bit spatial index values, or keys, four billion values or cells may be available per dimension to index 2D bins, two million values or cells may be available per dimension to index 3D bins, and sixty-four thousand values or cells may be available per dimension to index 4D bins. For 32-bit spatial index values, the number of values or cells per dimension drops further. For example, only eight values or cells may be available per dimension to index 4D bins using 32-bit spatial index values.

The bins may correspond to any suitable spatial partitioning of the space. For example, the bins may include one or more grids and/or cubes enclosing regions of the scene 200. The bins 122A may, for example, correspond to a spatial partitioning of a bounding shape of the spatial elements 224, such as a bounding shape 330 in FIG. 3A. For example, the bin determiner 104 may construct a $2^k \times 2^k \times 2^k$ lattice (where k refers to the quantity of bits used to quantize each coordinate) within the enclosing Axis-Aligned Bounding Box or shape (AABB) of the spatial elements 224 that are to be partitioned. The bins 122A and 122B are shown as two-dimensional bins forming a grid, for simplicity. However, in at least one embodiment, the bins 122A and/or the bins 122B include three-dimensional bins, for example, forming a cube or other shape. In various examples, the bins may include at least two dimensions and the bins 122A may have a same or different number of dimensions than the bins 122B. The bins may be the same size and/or shape or one or more of the bins may vary in size along one or more dimensions.

While FIG. 2 shows that the bins 122A and the bins 122B include sixteen bins, a set of bins may include any number of bins. By way of example, for three-dimensions bins, a set of bins may include X*Y*Z bins where X refers to the number of bins along the X-axis, Y refers to the number of bins along the Y-axis, and Z refers to the number of bins along the Z-axis. In at least one embodiment, each time the bin determiner 104 determines a set of bins for a given space to be partitioned, the set of bins have a same quantity of bins and/or a same configuration, or different quantities or configurations may be used for different sets. For example, the set of bins may form a multi-dimensional structure that is sized or scaled to the space to be partitioned (e.g., an 8 by 8 by 8 structure).

The bin assignor 106 may be configured to assign one or more spatial index values to one or more spatial elements of a space to determine one or more assignments of the one or more spatial elements to one or more sets of bins defined using the one or more spatial index values. For example, the bin assignor 106 may be configured to assign one or more of the spatial elements 224 to one or more bins of the bins 122A using spatial index values 230. The bin assignor 106 may also be configured to assign one or more of the spatial elements 224 to one or more bins of the bins 122B using one or more of the spatial index values 230, as indicated in FIG. 2, or different spatial index values. The assigning may include a Z-order encoding of the spatial elements 224 using the spatial index values. In the example shown, the spatial index values 230 include Morton codes, where each Morton code corresponds to a respective cell of the bins 122A and/or 122B.

In at least one embodiment, the bin assignor 106 is configured to assign a spatial element 224 to a bin based at least on the bin at least partially including the spatial element. For example, the bin assignor 106 may assign each spatial element 224 to a bin based at least on determining at least one portion of the spatial element 224 falls within the bin. In at least one embodiment, the bin assignor 106 may assign a spatial element 224 to a bin based at least on determining a centroid and/or one or more other points of the spatial element 224 (e.g., a barycenter) falls within the bin. For example, FIG. 2 indicates centroids of the spatial elements 224, which are within the bins to which they are assigned, such as a point 232 of the spatial element 224D within a bin 240.

Various approaches may be used to determine whether at least one portion of a spatial element 224 falls within a bin and different approaches may be used for assigning the spatial elements 224 to the bins 122A compared to assigning the spatial elements to the bins 122B. In at least one embodiment, a spatial element may be represented using a bounding shape, such as an Axis-Aligned Bounding Box or shape (AABB). The bin assignor 106 may determine the barycenter of the AABB of each spatial element and use the barycenter as a representative point of the spatial element. The bin assignor 106 may quantize the N coordinates of the representative point(s) of the spatial elements into k-bit integers. The bin assignor 106 may construct the Nk-bit Morton code for a point and/or spatial element based at least on interleaving the successive bits of the quantized coordinates. For example, for the X and Y coordinates of the point 232 may be quantized into an X coordinate of 00 and a Y coordinate of 01, which may be interleaved to result in a spatial index value of 0010. The other spatial elements may similarly be assigned to a bin using the corresponding spatial index values. For example, FIG. 2 shows a list 244 of spatial index values, which may be assigned respectively to the spatial elements 224G, 224C, 224D, 224E, 224F, 224A, and 224B.

In at least one embodiment, the bin assignor 106 stores one or more values indicating the assignments between the spatial elements and the multi-dimensional bins. For example, for each spatial element, the bin assignor 106 may store one or more values indicating the one or more spatial index values assigned to the spatial element. In at least one embodiment, the one or more values may indicate a count of spatial elements assigned to the one or more bins. In at least one embodiment, an assignment may include a spatial element identifier (ID) and spatial index value.

The partition determiner 108 may be configured to determine one or more partitions of the spatial elements based at least on one or more assignments between the one or more spatial elements and the one or more bins determined using the bin assignor 106. In at least one embodiment, the partition determiner 108 determines one or more partitions of the spatial elements based at least on sorting the spatial index values assigned to the spatial elements. For example, the list 244 may represent a sorted list of the spatial index values assigned to the spatial elements. In at least one embodiment, the spatial index values assigned to the spatial elements may be sorted into an order that indicates the spatial relationships between the spatial elements, such as a space-filling curve (e.g., a Morton curve). Thus, the partition determiner 108 may partition or group the spatial elements using the list 244 of spatial index values. For example, spatial elements that are close to each other in multidimensional space may have similar spatial index values and may be close to each other in the sorted order. In at least one embodiment, the partition determiner 108 groups or partitions the spatial elements based at least identifying one or more ranges of the spatial elements, where a range of the spatial elements may correspond to a partition of the spatial elements.

In at least one embodiment, the partition determiner 108 partitions the spatial elements using a divide-and-conquer approach. For example, the partition determiner 108 may recursively divide the list 244 into smaller sub-lists or ranges, such as may correspond to different nodes of the partitioning 120, until one or more criteria are satisfied.

Referring now to FIGS. 3A-3E, FIG. 3A is an example of a diagram illustrating the bounding shape 330 and the spatial elements 224 of the node 130A for the partitioning 120 of the spatial elements 224, in accordance with some embodiments of the present disclosure. FIGS. 3B-3E are examples of diagrams illustrating bounding shapes of partitions of spatial elements corresponding to the node 130A of FIG. 3A, in accordance with some embodiments of the present disclosure.

In the example shown, the node 130A may correspond to a root node of the partitioning 120. In various examples, the node 130A may correspond to a different type of node of the partitioning 120, such as an internal node or a leaf node. In examples where the node 130A corresponds to a root node, the node 130A may refer to a top-level node of the partitioning 120, which may encompass the entire scene 200 or object or region being partitioned. In at least one embodiment (e.g., for top-down approaches), a root node may serve as a starting point for determining the partitioning 120 and indicate the bounding volume or shape 330 that encloses all the spatial elements in the scene 200.

Figure 3A:
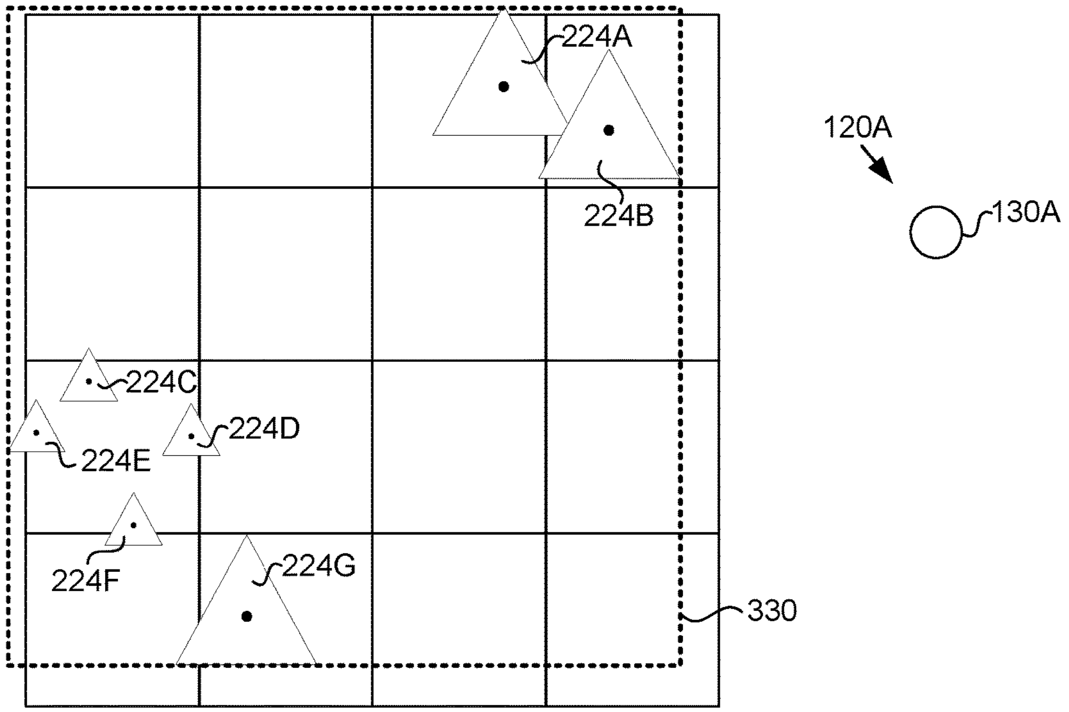
FIG. 3A is an example of a diagram illustrating a bounding shape and spatial elements of a root node for a partitioning of spatial elements, in accordance with some embodiments of the present disclosure.
Figure 3B:
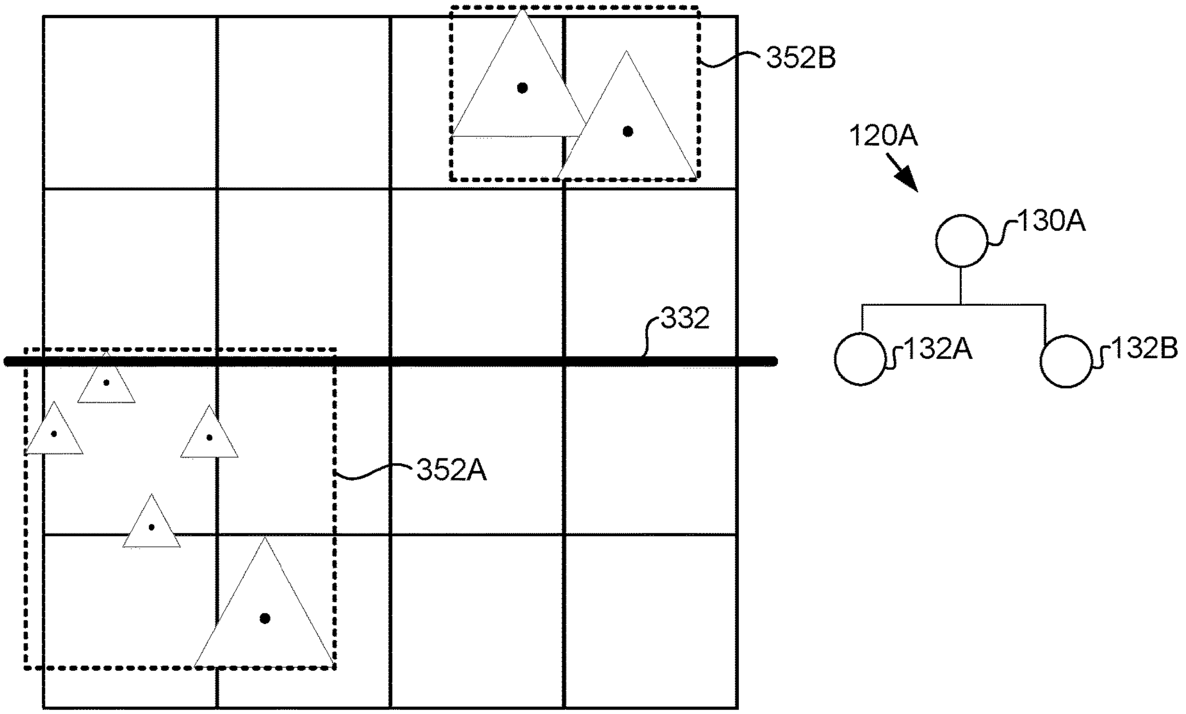
FIG. 3B is an example of a diagram illustrating bounding shapes of partitions of spatial elements corresponding to the root node of FIG. 3A, in accordance with some embodiments of the present disclosure.
Figure 3C:
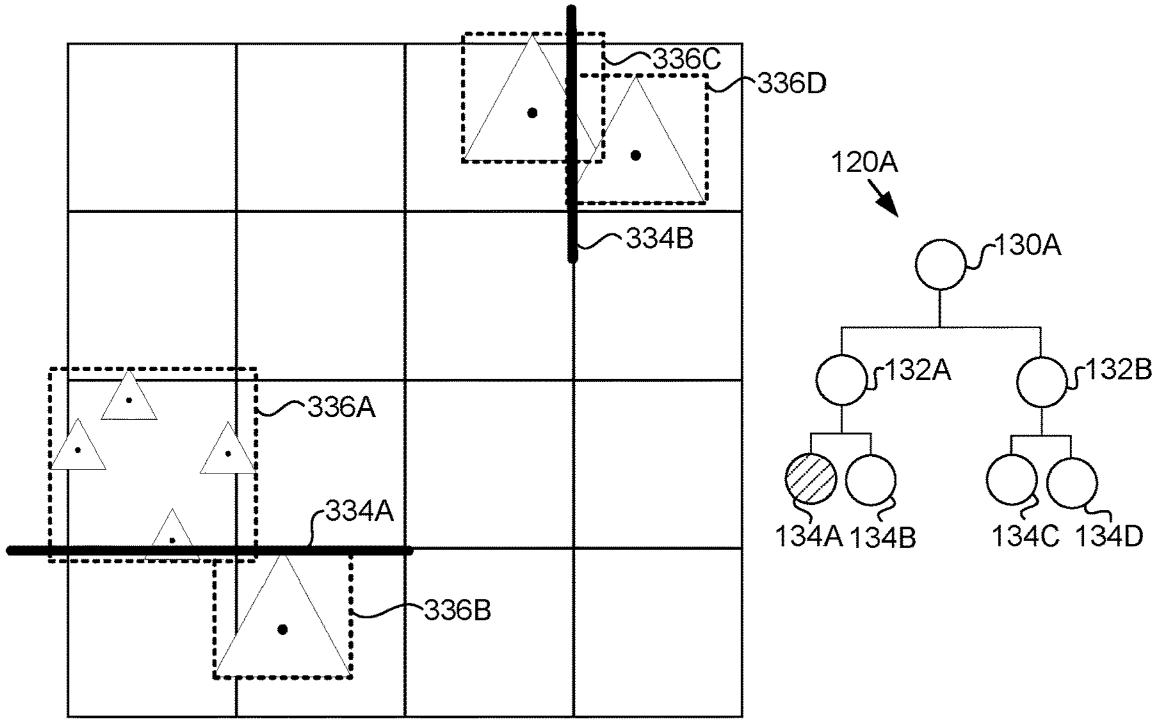
FIG. 3C is an example of a diagram illustrating bounding shapes of partitions of spatial elements corresponding to the partitions of FIG. 3B, in accordance with some embodiments of the present disclosure.
Figure 3D:
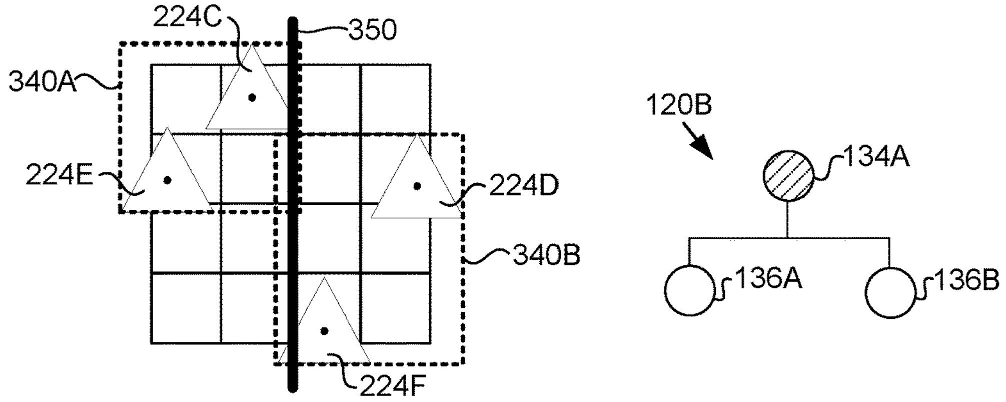
FIG. 3D is an example of a diagram illustrating bounding shapes of partitions of spatial elements corresponding to a partition of FIG. 3C, in accordance with some embodiments of the present disclosure.
Figure 3E:
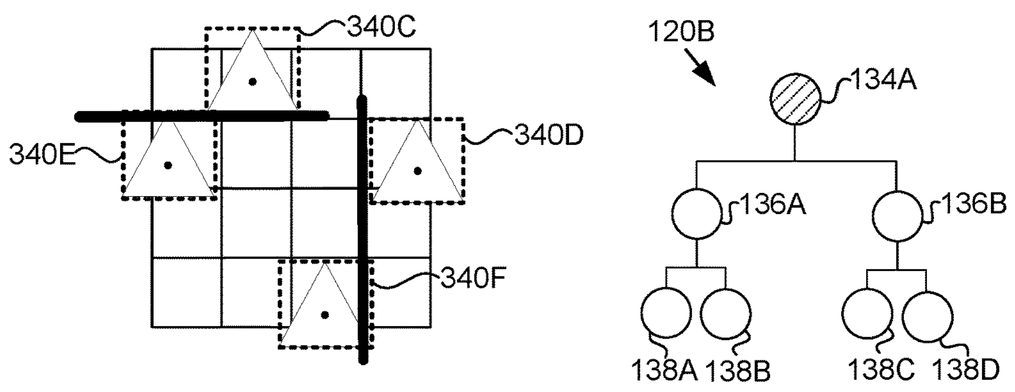
FIG. 3E is an example of a diagram illustrating bounding shapes of partitions of spatial elements corresponding to the partitions of FIG. 3D, in accordance with some embodiments of the present disclosure.

A node of the partitioning 120 may include, for example, one or more values (e.g., one or more bounding shape coordinates and/or dimensions) indicating one or more bounding volumes or shapes that encloses (e.g., tightly encloses) one or more spatial elements that correspond to the node. For example, FIG. 3A shows the bounding shape 330 which may correspond to the node 130A, FIG. 3B shows a bounding shape 352A corresponding to the node 132B and a bounding shape 352B corresponding to the node 132B, FIG. 3C shows a bounding shape 336A corresponding to the node 134A, a bounding shape 336B corresponding to the node 134B, a bounding shape 336C corresponding to the node 134C, and a bounding shape 336D corresponding to the node 134D, FIG. 3C shows a bounding shape 338A corresponding to the node 136A and a bounding shape 338B corresponding to the node 136B, and FIG. 3D shows a bounding shape 340E corresponding to the node 138A, a bounding shape 340C corresponding to the node 138B, a bounding shape 340F corresponding to the node 138C, and a bounding shape 340D corresponding to the node 138D.

A node of the partitioning 120 may also include, for example, one or more values (e.g., one or more pointers) indicating one or more children of the node. For example, the node 130A may indicate the node 132A and the node 132B (e.g., internal nodes of the partitioning 120) are child nodes to the node 130A. The children of a node may further subdivide the spatial elements 224.

A node of the partitioning 120 may also include, for example, one or more values (e.g., one or more pointers) indicating one or more spatial elements of the node. For example, the node 132A may indicate the spatial elements 224C, 224D, 224E, 224F, and 224G. While the various nodes are described as being example of root, internal, or leaf nodes, they may refer to other types of nodes in the process 100.

The nodes of the partitioning 120 may also include addition or alternative information depending on the implementation and requirements of the application, such as, for example, bin information of multi-dimensional bins that correspond to the node (e.g., counters of spatial elements within a bin(s), aggregated bounding boxes of spatial elements within a bin(s), centroid bounds of the spatial elements within a bin(s), etc.), one or more splitting planes that correspond to the node, and/or metadata that may be used for traversal and/or modification of the partitioning 120.

In at least one embodiment, the order of the list 244 indicates one or more candidate split planes, which the partition determiner 108 may identify based at least on analyzing the list 244. For example, the partition determiner 108 may identify a split plane 332 corresponding to the spatial elements 224 of the node 130A based at least on the spatial index values. In at least one embodiment, the partition determiner 108 may be used to construct a level split of the node 130A based at least on analyzing the most significant bit of the spatial index values in the list 244. For example, a transition between a most significant bit of 0 to 1 may indicate the split plane 332. Based at least on the split plane 332, the partition determiner 108 may include one or more spatial elements having 0 as a most significant bit in a first group or partition, and one or more spatial elements having 1 as a most significant bit in a second group or partition. In at least one embodiment, the node manager 102 may determine the node 132A corresponding to the first group or partition, and the node 132B corresponding to the second group or partition.

In at least one embodiment, the partition determiner 108 may be used to construct subsequent splits of the groups or partitions based at least on analyzing corresponding ranges of the list 244 to identify one or more additional split planes. For example, given the list 244 includes {0001, 0010, 0010, 0010, 0010, 1110, 1111}, the node 132A may correspond to the range {0001, 0010, 0010, 0010, 0010} and the node 132B may correspond to the range {1110, 1111}. The partition determiner 108 may determine a subsequent level split for the node 132A based at least on analyzing one or more subsequent significant bits of the spatial index values in the corresponding sub-range of the list 244. For example, the partition determiner 108 may analyze the second most significant bit of the spatial index values in the corresponding sub-range of the list 244, which may indicate a corresponding split plane. However, the partition manager 108 may discard the candidate split plane based at least on one or more criteria, such as determining the split plane does not further divide the spatial elements of the node 132A. Similarly, the partition manager 108 may identify other bits of the spatial index values corresponding to a split plane 334A. The partition determiner 108 may include one or more spatial elements having 0 as a third most significant bit in a first group or partition of the node 132A, and one or more spatial elements having 1 as a third most significant bit in a second group or partition of the node 132A. In at least one embodiment, the node manager 102 may determine the node 134A corresponding to the first group or partition, and the node 134B corresponding to the second group or partition.

Similarly, the partition determiner 108 may determine a subsequent level split for the node 132B based at least on analyzing one or more subsequent significant bits of the spatial index values in the corresponding sub-range of the list 244. For example, the partition manager 108 may identify other bits of the spatial index values corresponding to a split plane 334B. The partition determiner 108 may include one or more spatial elements having 0 as a fourth most significant bit in a first group or partition of the node 132B, and one or more spatial elements having 1 as a third most significant bit in a second group or partition of the node 132 fourth. In at least one embodiment, the node manager 102 may determine the node 134C corresponding to the first group or partition, and the node 134D corresponding to the second group or partition.

In various examples, the partition determiner 108 recursively evaluates split planes, where in each recursive step, the partition determiner 108 may sort a corresponding range of spatial index values and examine and evaluate the subsequent bit in the spatial index values (to evaluate corresponding split planes) using the sorted range until all bits are consumed. While the example shown may use a radix-2 sorting algorithm, a radix-b sorting algorithm may be used to sort each range, in which the range may be sorted based on $\log_2 b$ bits at a time to provide a partitioning 120 with a branching factor $2^b$, rather than a binary tree.

In at least one embodiment, the partition determiner 108 may run out of bits to examine for assignments to a set of bins, such that one or more nodes cannot be further partitioned using the assignments to a set of bins. For example, the partition determiner 108 may be unable to further partition the node 134A using the assignments to the bins 122A. However, the one or more nodes may include multiple spatial elements, which may limit the effectiveness of the partitioning. For example, the node 134A includes the spatial elements 224C, 224D, 224E, and 224F, although many more spatial elements may be included in the node 134A and/or one or more other nodes. A large number of spatial elements being assigned to the same leaf node may impact the ability of a BVH to effectively accelerate ray intersection testing for corresponding regions of the scene.

Using disclosed approaches, the bin determiner 104 and the bin assignor 106 may be used to determine one or more assignments of one or more subsets of the spatial elements 224 to one or more additional sets of bins, such that the spatial elements 224 can be more granularly partitioned in corresponding regions of the space. For example, the bin determiner 104 may be used to determine the bins 122B and the bin assignor 106 may be used to assign the spatial elements 224C, 224D, 224E, and 224F to the bins 122B. The node manager 102 may then use the partition determiner 108 and the assignments to the bins 122B to further partition the spatial elements 224C, 224D, 224E, and 224F and determine corresponding nodes of the partitioning 120. For example, the node manager 102 use the assignments to the bins 122B to determine the portion 120B of the partitioning 120.

The bin determiner 104 may determine the bins 122B using similar or different approaches as used to determine the bins 122A, which may consider any of the various factors described herein. For example, the bins 122B may be determine based at least on the spatial elements 224C, 224D, 224E, and 224F and/or a bounding shape 336A corresponding to the spatial elements 224C, 224D, 224E, and 224F. While the bin determiner 104 is shown as determining the bins 122B after the node manager 102 determines the node 134A, the bins 122B and/or other sets of bins may be determined at any suitable time. By way of example, and not limitation, the bins 122B are similar to the bins 122A, but have a lower resolution.

The bin assignor 106 may assign spatial elements to the bins 122B using similar or different approaches as used to assign spatial elements to the bins 122A. For example, as shown in FIG. 2, the bin assignor 106 may use spatial index values to perform the assignments. The example of FIG. 2 uses the same spatial index values as used to assign spatial elements to the bins 122A, however, other spatial index values and/or types of spatial index values may be used.

In one or more embodiments, the additional partitioning of the spatial elements may be performed using a same, similar, or different approach as described with respect to the portion 120A or the partitioning 120. For example, to determine the portion 120B, other partitioning approaches may be used, such approaches using other mechanisms to determine and/or evaluate one or more split planes, or top-down or bottom-up approaches. As an example, other types of spatial index values may be used, which can be ordered to indicate a space-filling curve used to determine and evaluate one or more split planes.

Additionally, or alternatively, to determine assignments between spatial elements and multi-dimensional bins (e.g., the bins 122B), the bin assignor 106 may be configured to project spatial elements into the bins along one or more dimensions. For example, one or more portions (e.g., centroids) of the spatial elements may be projected along an X-axis, a Y-axis, and/or a Z-axis to determine which spatial elements fall within which bins along the dimensions. The bin assignor 106 may then assign the spatial elements to the bins that the one or more portions fall within. For example, for each bin, the bin assignor 106 may store a count of spatial elements assigned to the bin, an aggregation of bounding boxes of the spatial elements assigned to the one or more bins, and the bounds of centroids or other portions of the spatial elements assigned to the one or more bins. When partitioning spatial elements using a split plane, the centroid bounds may be used to determine which side of a split plane includes the spatial element(s) from a particular bin. A heuristic, such as a Surface Area Heuristic (SAH), may be used to evaluate candidate split planes.

In the example shown, the bin assignor 106 may be used to determine a list 246 of spatial index values, which may be assigned respectively to the spatial elements 224F, 224E, 224C, and 224D using a similar approaches as the list 244. In at least one embodiment, one or more of the assignments of the spatial index values may overwrite one or more assignments of the list 246 in memory. For example, the assignments corresponding to the list 246 may overwrite a sub-range 250 of the list 244 based at least on the sub-range 250 corresponding to assignments for the spatial elements that are assigned (e.g., re-assigned) to the bins 122B. In at least one embodiment, the sub-range 250 may be overwritten based at least on the partition determiner 108 analyzing the assignments to the bins 122A. For example, based at least on the partition determiner 108 consuming all of the bits of the sub-range 250 to evaluate corresponding split planes, the sub-range 250 may be overwritten.

The partition determiner 108 may use the list 246 (e.g., stored in the sub-range 250) to further partition the spatial elements, using a similar or different approaches as the list 244. Thus, the node manager 102 may use the bins 122 to determine the portion 120B of the partitioning 120 of the spatial elements 224. For example, the partition manager 108 use the list 246 to determine the node 136A corresponding to the spatial elements 224E and 224C and the node 136B corresponding to the spatial elements 224D and 224F using a split plane 350. The partition manager 108 use sub-ranges or portions of the list 246 to determine the node 138A corresponding to the spatial element 224E, the node 138B corresponding to the spatial element 224C, the node 138C corresponding to the spatial element 224F, and the node 138D corresponding to the spatial element 224F.

While the bins 122B are described as being assigned to the spatial elements 224C, 224D, 224E, and 224F, the bins 112B may be used to assign any number of spatial elements which may or more not correspond to the same node. Further, any number of set of bins may be determined and/or assigned to any number of spatial elements for partitioning the spatial elements. Additionally, one or more additional sets of bins may be determined and assigned to spatial elements to further partition any number of the spatial elements and/or nodes.

As described herein, the node manager 102 may use the bin determiner 104 to determine one or more additional sets of bins, such as the bins 122B, at any suitable time. In at least one example, one or more additional sets of bins for a subset of the spatial elements may be determined based at least on analyzing one or more nodes corresponding to the subset in the partitioning of the space. In one or more embodiments, the determination of additional bins, assignments of the additional bins, and/or partitioning using the additional bins may be incorporated into the recursive partitioning algorithm described herein. As an example, when the recursive algorithm determines or generates the node 134A, the node manager 102 may determine to generate the bins 122B and assign the bins 122B to the spatial elements 224C, 224D, 224E, and 224F. The node manager 102 may then continue recursively partitioning the spatial elements 224C, 224D, 224E, and 224F using the new bin assignments.

The node manager 102 may determine to generate additional bins and/or assign additional bins to a subset(s) of spatial elements based at least on any combination of potential criteria. In at least one embodiment, the determination is based at least on a quantity of spatial elements in the subset(s). For example, where the quantity of spatial elements in the subset(s) is greater than a threshold value(s), the node manager 102 may determine to generate additional bins and/or assign additional bins to the subset(s) of spatial elements. In at least one embodiment, the node manager 102 determines and evaluates the quantity of spatial elements, for example, based at least on comparing the quantity to the threshold value(s).

Additionally, or alternatively, the node manager 102 may determine to generate additional bins and/or assign additional bins to a subset(s) based at least on determining the assignments to the bins 112A indicate a subset of the spatial elements corresponds to a same subregion of the scene 200. For example, the node manager 102 may determine to generate additional bins and/or assign additional bins to a subset(s) based at least on determining the assignments to the bins 122A indicate the spatial elements correspond to one or more bins of the bins 122A. As an example, the node manager 102 may determine to generate additional bins and/or assign additional bins to the spatial elements 224C, 224D, 224E, and 224F based at least on determining the assignments to the bins 122A indicate the spatial elements 224C, 224D, 224E, and 224F correspond to a same bin (the bin 240) and/or node (the node 134A).

Additionally, or alternatively, the node manager 102 may determine to generate additional bins and/or assign additional bins to a subset(s) based at least on determining the assignments to the bins 112A indicate a subset of the spatial elements corresponds to one or more spatial index values. For example, the node manager 102 may determine to generate additional bins and/or assign additional bins to a subset(s) based at least on determining assignments to the bins 122A indicate the spatial elements correspond to a same spatial index value. As an example, the node manager 102 may determine to generate additional bins and/or assign additional bins to the spatial elements 224C, 224D, 224E, and 224F based at least on determining the assignments to the bins 122A indicate the spatial elements 224C, 224D, 224E, and 224F correspond to a same spatial index value (e.g., 0010).

Additionally, or alternatively, the node manager 102 may determine to generate additional bins and/or assign additional bins to a subset(s) based at least on one or more dimensions and/or a size of a region(s) of the space 200 that corresponds to the subset(s). For example, where the size(s) and/or dimensions of the region(s) is greater than a threshold value(s), the node manager 102 may determine to generate additional bins and/or assign additional bins to the subset(s) of spatial elements. In at least one embodiment, the node manager 102 determines and evaluates one or more of the dimensions and/or the size(s), for example, based at least on comparing one or more corresponding values to the threshold value(s). In at least one embodiment, the dimensions and/or size may be based at least on one or more the bounding shape values of spatial elements and/or an aggregation of the spatial elements. For example, the dimensions and/or size for the spatial elements 224C, 224D, 224E, and/or 224F may correspond to the bounding shape 336A and/or bounding shapes 340C, 340D, 340E, and/or 340F.

Additionally, or alternatively, the node manager 102 may determine to generate additional bins and/or assign additional bins to a subset(s) based at least on a spatial density of the subset spatial elements and/or a distribution of the spatial elements to be partitioned. For example, the node manager 102 may be more likely to determine to generate and/or assign additional bins as the spatial density increases. In at least one embodiment, the node manager 102 may determine the spatial density based at least on the size(s) and/or dimensions of the region(s) corresponding to the subset(s) and/or the quantity of spatial elements in the subset(s).

Additionally, or alternatively, the node manager 102 may determine to generate additional bins and/or assign additional bins to a subset(s) based at least on a bit length and/or quantity of bits used to represent the spatial index values and/or a number of bits consumed (e.g., all of the bits) in evaluating the spatial index values for partitioning, as described herein. Additionally, or alternatively, the node manager 102 may determine to generate additional bins and/or assign additional bins to a subset(s) based at least on the initial bin assignments indicating the subset(s) correspond to a leaf node(s) of the partitioning.

Additionally, or alternatively, the node manager 102 may determine to generate additional bins and/or assign additional bins to a subset(s) based at least on one or more of memory or computational resources available and/or allocated to the system and/or the construction of the partitioning 120. Additionally, or alternatively, the node manager 102 may determine to generate additional bins and/or assign additional bins to a subset(s) based at least on one or more metrics associated with the partitioning 120. Examples include one or more query performance metrics when using the partitioning 120, one or more traversal efficiency metrics when using the partitioning 120, one or more memory usage metrics associated with the partitioning 120, one or more construction time and/or resource metrics for determining the partitioning 120, one or more cache coherence metrics for constructing and/or using the partitioning 120, and/or one or more metrics corresponding to any of the various criteria described herein.

Figure 4:
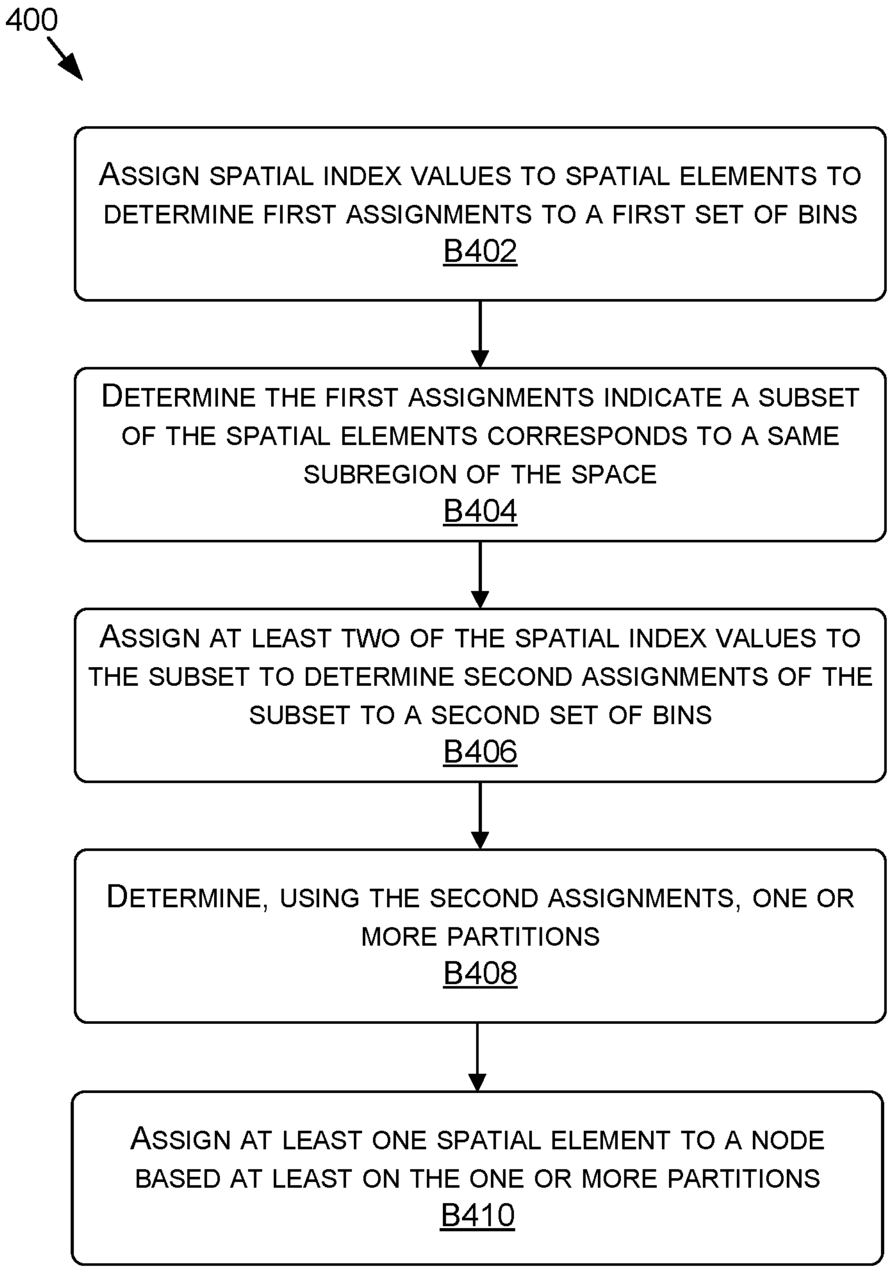
FIG. 4 is a flow diagram showing a method for binning spatial elements based on assignments of spatial index values indicating a subset of the spatial elements correspond to a same subregion of a space, in accordance with embodiments of the present disclosure.
Figure 5:
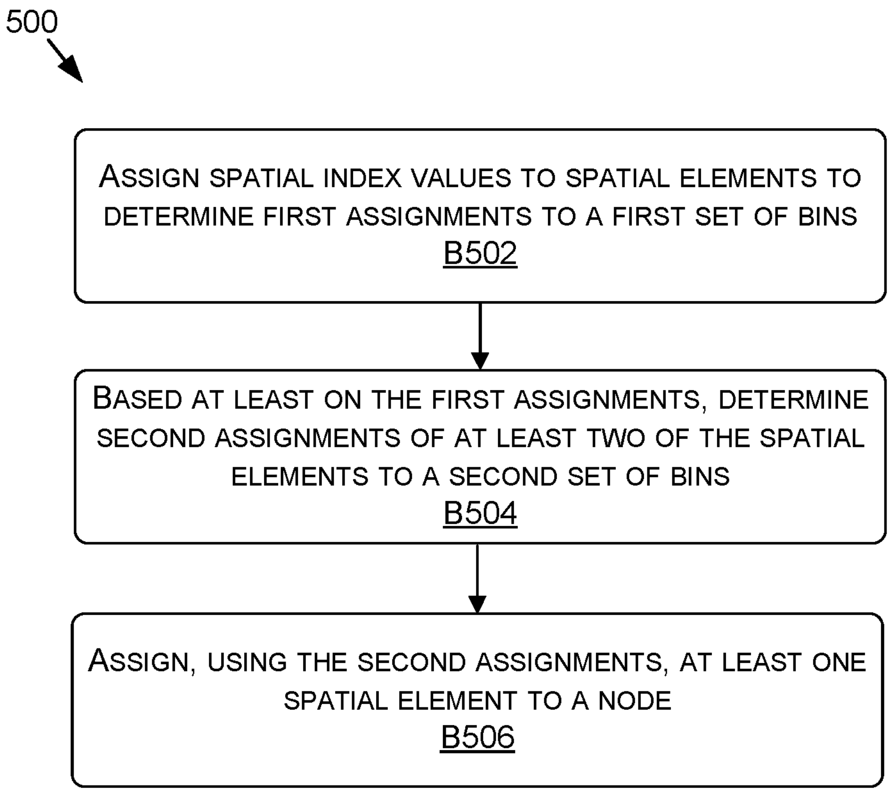
FIG. 5 is a flow diagram showing a method for binning spatial elements based on assignments of spatial index values to spatial elements, in accordance with embodiments of the present disclosure.

Now referring to FIGS. 4 and 5, each block of method 400, method 500, and other methods described herein, comprises a computing process that may be performed using any combination of hardware, firmware, and/or software. For instance, various functions may be carried out by a processor executing instructions stored in memory. The methods may also be embodied as computer-usable instructions stored on computer storage media. The methods may be provided by a standalone application, a service or hosted service (standalone or in combination with another hosted service), or a plug-in to another product, to name a few. In addition, the methods are described, by way of example, with respect to the process 100 of FIG. 1 and FIG. 2. However, these methods may additionally or alternatively be executed by any one system, or any combination of systems, including, but not limited to, those described herein.

FIG. 4 is a flow diagram showing a method 400 for binning spatial elements based on assignments of spatial index values indicating a subset of the spatial elements correspond to a same subregion of a space, in accordance with embodiments of the present disclosure. The method 400, at block B402, includes assigning spatial index values to spatial elements to determine first assignments to a first set of bins. For example, the bin assignor 106 may assign the spatial index values 230 to the spatial elements 224 of the space 200 to determine assignments (e.g., corresponding to the list 244) of the spatial elements 224 to the bins 122A corresponding to the spatial index values 230.

At block B404, the method 400 includes determining the first assignments indicate a subset of the spatial elements corresponds to a same subregion of the space. For example, the node manager 102 may determine the first assignments indicate a subset of the spatial elements 224 (e.g., the spatial elements 224C, 224D, 224E, and 224F) corresponds to a same subregion of the space 200 (e.g., the bin 240).

At block B406, the method 400 includes assigning at least two of the spatial index values to the subset to determine second assignments of the of subset to a second set of bins. For example, based at least on the determining, the bin assignor 106 may assign at least two of the spatial index values 230 to the subset of spatial elements to determine second assignments (e.g., corresponding to the list 246) of the of subset of spatial elements to the bins 122B corresponding to the at least two of the spatial index values 230.

At block B408, the method 400 includes determining, using the second assignments, one or more partitions. For example, the partition determiner 108 may determine, using the second assignments, one or more partitions of the subset of the spatial elements.

At block B410, the method 400 includes assigning at least one spatial element of the spatial elements to a node based at least on the one or more partitions. For example, the node manager 102 may assign at least one spatial element of the spatial elements to a node corresponding to the portion 120B of the partitioning 120 based at least on the one or more partitions.

FIG. 5 is a flow diagram showing a method 500 for binning spatial elements based on assignments of spatial index values to spatial elements, in accordance with embodiments of the present disclosure. The method 500, at block B502, includes assigning spatial index values to spatial elements to determine first assignments to a first set of bins. For example, the bin assignor 106 may assign the spatial index values 230 to the spatial elements 224 of the space 200 to determine assignments (e.g., corresponding to the list 244) of the spatial elements 224 to the bins 122A corresponding to the spatial index values 230.

At block B504, the method 500 includes based at least on the first assignments, determining second assignments of at least two of the spatial elements to a second set of bins. For example, based at least on the first assignments including at least two of the spatial elements (e.g., the spatial elements 224C, 224D, 224E, and 224F) assigned to a same spatial index value (e.g., 0010), the bin assignor 106 may determine second assignments of the at least two of the spatial elements to the bins 122B.

At block B506, the method 500 includes assigning, using the second assignments, at least one spatial element to a node. For example, the node manager 102 may assign, using the second assignments, at least one spatial element of the spatial elements to a node corresponding to the portion 120B of the partitioning 120.

Example Parallel Processing Architecture

Figure 6:
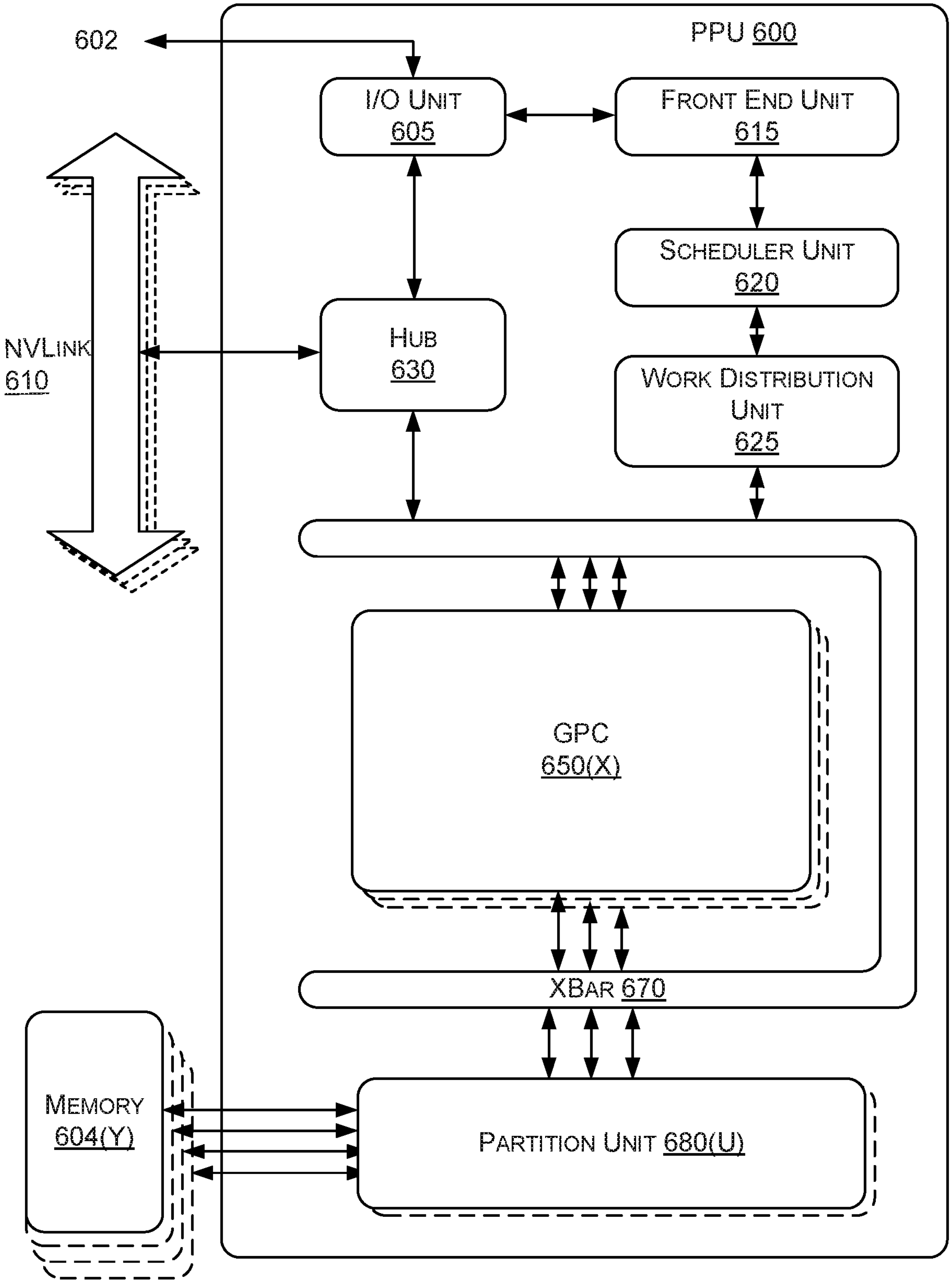
FIG. 6 illustrates an example parallel processing unit suitable for use in implementing at least some embodiments of the present disclosure.

FIG. 6 illustrates an example parallel processing unit (PPU) 600 suitable for use in implementing at least some embodiments of the present disclosure. In at least one embodiment, the PPU 600 is a multi-threaded processor that is implemented on one or more integrated circuit devices. The PPU 600 may have a latency hiding architecture designed to process many threads in parallel. A thread (e.g., a thread of execution) may refer to an instantiation of a set of instructions configured to be executed by the PPU 600. In at least one embodiment, the PPU 600 is a graphics processing unit (GPU) configured to implement a graphics rendering pipeline for processing three-dimensional (3D) graphics data in order to generate two-dimensional (2D) image data for display on a display device such as a liquid crystal display (LCD) device. In one or more embodiments, the PPU 600 may be used for performing general-purpose computations. While one parallel processor is provided herein for illustrative purposes, it should be noted that such processor is set forth for illustrative purposes only, and that any processor may be employed to supplement and/or substitute for the same.

One or more PPUs 600 may be configured to accelerate, by way of example and not limitation, thousands of High-Performance Computing (HPC), data center, and machine learning applications. The PPU 600 may be configured to accelerate numerous deep learning systems and applications including autonomous vehicle platforms, deep learning, high-accuracy speech, image, and text recognition systems, intelligent video analytics, molecular simulations, drug discovery, disease diagnosis, weather forecasting, big data analytics, light transport simulation, astronomy, molecular dynamics simulation, financial modeling, robotics, digital twinning, synthetic data generation, generative artificial intelligence using one or more large language models (LLMs) and/or one or more vision language models (VLMs), factory automation, real-time language translation, online search optimizations, personalized user recommendations, and the like.

As shown in FIG. 6, the PPU 600 includes an Input/Output (I/O) unit 605, a front end unit 615, a scheduler unit 620, a work distribution unit 625, a hub 630, a crossbar (Xbar) 670, one or more general processing clusters (GPCs) 650, and one or more partition units 680. The PPU 600 may be connected to a host processor or other PPUs 600 via one or more high-speed NVLink 610 interconnect. The PPU 600 may be connected to a host processor or other peripheral devices via an interconnect 602. The PPU 600 may also be connected to a local memory comprising a number of memory devices 604. In at least one embodiment, the local memory may comprise a number of dynamic random-access memory (DRAM) devices. The DRAM devices may be configured as a high-bandwidth memory (HBM) subsystem, with multiple DRAM dies stacked within each device.

The NVLink 610 interconnect enables systems to scale and include one or more PPUs 600 combined with one or more CPUs, supports cache coherence between the PPUs 600 and CPUs, and CPU mastering. Data and/or commands may be transmitted by the NVLink 610 through the hub 630 to/from other units of the PPU 600 such as one or more copy engines, a video encoder, a video decoder, a power management unit, etc. (not explicitly shown).

The I/O unit 605 may be configured to transmit and receive communications (e.g., commands, data, etc.) from a host processor (not shown) over the interconnect 602. The I/O unit 605 may communicate with the host processor directly via the interconnect 602 or through one or more intermediate devices such as a memory bridge. In at least one embodiment, the I/O unit 605 may communicate with one or more other processors, such as one or more the PPUs 600 via the interconnect 602. In at least one embodiment, the I/O unit 605 implements a Peripheral Component Interconnect Express (PCIe) interface for communications over a PCIe bus and the interconnect 602 is a PCIe bus. In at least one embodiment, the I/O unit 605 may implement other types of well-known interfaces for communicating with external devices.

The I/O unit 605 decodes packets received via the interconnect 602. In at least one embodiment, the packets represent commands configured to cause the PPU 600 to perform various operations. The I/O unit 605 transmits the decoded commands to various other units of the PPU 600 as the commands may specify. For example, some commands may be transmitted to the front end unit 615. Other commands may be transmitted to the hub 630 or other units of the PPU 600 such as one or more copy engines, a video encoder, a video decoder, a power management unit, etc. (not explicitly shown). In other words, the I/O unit 605 may be configured to route communications between and among the various logical units of the PPU 600.

In at least one embodiment, a program executed by the host processor encodes a command stream in a buffer that provides workloads to the PPU 600 for processing. A workload may comprise several instructions and data to be processed by those instructions. The buffer may be a region in a memory that is accessible (e.g., read/write) by both the host processor and the PPU 600. For example, the I/O unit 605 may be configured to access the buffer in a system memory connected to the interconnect 602 via memory requests transmitted over the interconnect 602. In at least one embodiment, the host processor writes the command stream to the buffer and then transmits a pointer to the start of the command stream to the PPU 600. The front end unit 615 receives pointers to one or more command streams. The front end unit 615 manages the one or more streams, reading commands from the streams and forwarding commands to the various units of the PPU 600.

The front end unit 615 is coupled to a scheduler unit 620 that configures the various GPCs 650 to process tasks defined by the one or more streams. The scheduler unit 620 is configured to track state information related to the various tasks managed by the scheduler unit 620. The state may indicate which GPC 650 a task is assigned to, whether the task is active or inactive, a priority level associated with the task, and so forth. The scheduler unit 620 manages the execution of a plurality of tasks on the one or more GPCs 650.

The scheduler unit 620 is coupled to a work distribution unit 625 that is configured to dispatch tasks for execution on the GPCs 650. The work distribution unit 625 may track a number of scheduled tasks received from the scheduler unit 620. In at least one embodiment, the work distribution unit 625 manages a pending task pool and an active task pool for each of the GPCs 650. The pending task pool may comprise a number of slots (e.g., 32 slots) that contain tasks assigned to be processed by a particular GPC 650. The active task pool may comprise a number of slots (e.g., 4 slots) for tasks that are actively being processed by the GPCs 650. As a GPC 650 finishes the execution of a task, that task may be evicted from the active task pool for the GPC 650 and one of the other tasks from the pending task pool is selected and scheduled for execution on the GPC 650. If an active task has been idle on the GPC 650, such as while waiting for a data dependency to be resolved, then the active task may be evicted from the GPC 650 and returned to the pending task pool while another task in the pending task pool is selected and scheduled for execution on the GPC 650.

The work distribution unit 625 communicates with the one or more GPCs 650 via XBar 670. The XBar 670 is an interconnect network that couples many of the units of the PPU 600 to other units of the PPU 600. For example, the XBar 670 may be configured to couple the work distribution unit 625 to a particular GPC 650. Although not shown explicitly, one or more other units of the PPU 600 may also be connected to the XBar 670 via the hub 630.

The tasks are managed by the scheduler unit 620 and dispatched to a GPC 650 by the work distribution unit 625. The GPC 650 is configured to process the task and generate results. The results may be consumed by other tasks within the GPC 650, routed to a different GPC 650 via the XBar 670, or stored in the memory 604. The results can be written to the memory 604 via the partition units 680, which may implement a memory interface for reading and writing data to/from the memory 604. The results can be transmitted to another PPU 600 or CPU via the NVLink 610. In at least one embodiment, the PPU 600 includes a number U of partition units 680 that is equal to the number of separate and distinct memory devices 604 coupled to the PPU 600.

In at least one embodiment, a host processor executes a driver kernel that implements an application programming interface (API) that enables one or more applications executing on the host processor to schedule operations for execution on the PPU 600. In at least one embodiment, multiple compute applications are simultaneously executed by the PPU 600 and the PPU 600 provides isolation, quality of service (QOS), and independent address spaces for the multiple compute applications. An application may generate instructions (e.g., API calls) that cause the driver kernel to generate one or more tasks for execution by the PPU 600. The driver kernel may output tasks to one or more streams being processed by the PPU 600. Each task may comprise one or more groups of related threads, wherein may be referred to as a warp. In at least one embodiment, a warp comprises 32 related threads that may be executed in parallel. Cooperating threads may refer to a plurality of threads including instructions to perform the task and that may exchange data through shared memory.

Figure 7A:
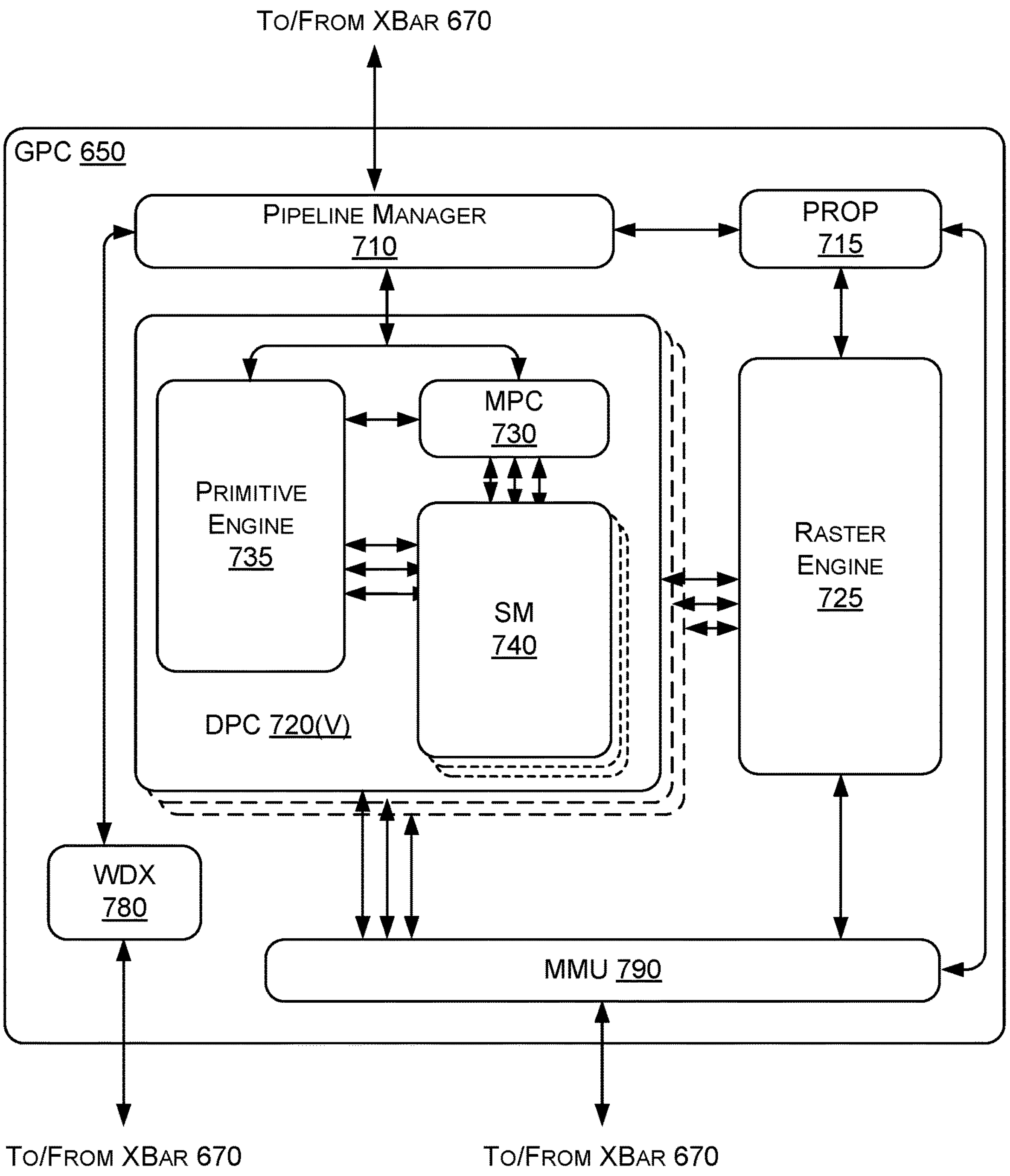
FIG. 7A illustrates an example general processing cluster within the parallel processing unit of FIG. 6 suitable for use in implementing at least some embodiments of the present disclosure.

FIG. 7A illustrates an example GPC 650 of the PPU 600 of FIG. 6 suitable for use in implementing at least some embodiments of the present disclosure. As shown in FIG. 7A, each GPC 650 may include a number of hardware units for processing tasks. In at least one embodiment, each GPC 650 includes a pipeline manager 710, a pre-raster operations unit (PROP) 715, a raster engine 725, a work distribution crossbar (WDX) 780, a memory management unit (MMU) 790, and one or more Data Processing Clusters (DPCs) 720. It will be appreciated that the GPC 650 of FIG. 7A may include other hardware units in lieu of or in addition to the units shown in FIG. 7A.

In at least one embodiment, the operation of the GPC 650 is controlled by the pipeline manager 710. The pipeline manager 710 manages the configuration of the one or more DPCs 720 for processing tasks allocated to the GPC 650. In at least one embodiment, the pipeline manager 710 may configure at least one of the one or more DPCs 720 to implement at least a portion of a graphics rendering pipeline. For example, a DPC 720 may be configured to execute a vertex shader program on the programmable streaming multiprocessor (SM) 740. The pipeline manager 710 may also be configured to route packets received from the work distribution unit 625 to the appropriate logical units within the GPC 650. For example, some packets may be routed to fixed function hardware units in the PROP 715 and/or raster engine 725 while other packets may be routed to the DPCs 720 for processing by the primitive engine 735 or the SM 740. In at least one embodiment, the pipeline manager 710 may configure at least one of the one or more DPCs 720 to implement a neural network model and/or a computing pipeline.

The PROP unit 715 may be configured to route data generated by the raster engine 725 and the DPCs 720 to a Raster Operations (ROP) unit. The PROP unit 715 may also be configured to perform optimizations for color blending, organizing pixel data, performing address translations, and the like.

The raster engine 725 may include a number of fixed function hardware units configured to perform various raster operations. In at least one embodiment, the raster engine 725 includes a setup engine, a coarse raster engine, a culling engine, a clipping engine, a fine raster engine, and a tile coalescing engine. The setup engine receives transformed vertices and generates plane equations associated with the geometric primitive defined by the vertices. The plane equations are transmitted to the coarse raster engine to generate coverage information (e.g., an x,y coverage mask for a tile) for the primitive. The output of the coarse raster engine is transmitted to the culling engine where fragments associated with the primitive that fail a z-test are culled, and transmitted to a clipping engine where fragments lying outside a viewing frustum are clipped. Those fragments that survive clipping and culling may be passed to the fine raster engine to generate attributes for the pixel fragments based on the plane equations generated by the setup engine. The output of the raster engine 725 comprises fragments to be processed, for example, by a fragment shader implemented within a DPC 720.

Each DPC 720 included in the GPC 650 includes an M-Pipe Controller (MPC) 730, a primitive engine 735, and one or more SMs 740. The MPC 730 controls the operation of the DPC 720, routing packets received from the pipeline manager 710 to the appropriate units in the DPC 720. For example, packets associated with a vertex may be routed to the primitive engine 735, which is configured to fetch vertex attributes associated with the vertex from the memory 604. In contrast, packets associated with a shader program may be transmitted to the SM 740.

The SM 740 comprises a programmable streaming processor that is configured to process tasks represented by a number of threads. Each SM 740 is multi-threaded and configured to execute a plurality of threads (e.g., 32 threads) from a particular group of threads concurrently. In at least one embodiment, the SM 740 implements a SIMD (Single-Instruction, Multiple-Data) architecture where each thread in a group of threads (e.g., a warp) is configured to process a different set of data based on the same set of instructions. All threads in the group of threads execute the same instructions. In at least one embodiment, the SM 740 implements a SIMT (Single-Instruction, Multiple Thread) architecture where each thread in a group of threads is configured to process a different set of data based on the same set of instructions, but where individual threads in the group of threads are allowed to diverge during execution. In at least one embodiment, a program counter, call stack, and execution state is maintained for each warp, enabling concurrency between warps and serial execution within warps when threads within the warp diverge. In another embodiment, a program counter, call stack, and execution state is maintained for each individual thread, enabling equal concurrency between all threads, within and between warps. When execution state is maintained for each individual thread, threads executing the same instructions may be converged and executed in parallel for maximum efficiency.

The MMU 790 may provide an interface between the GPC 650 and the partition unit 680. The MMU 790 may provide translation of virtual addresses into physical addresses, memory protection, and arbitration of memory requests. In at least one embodiment, the MMU 790 provides one or more translation lookaside buffers (TLBs) for performing translation of virtual addresses into physical addresses in the memory 604.

Figure 7B:
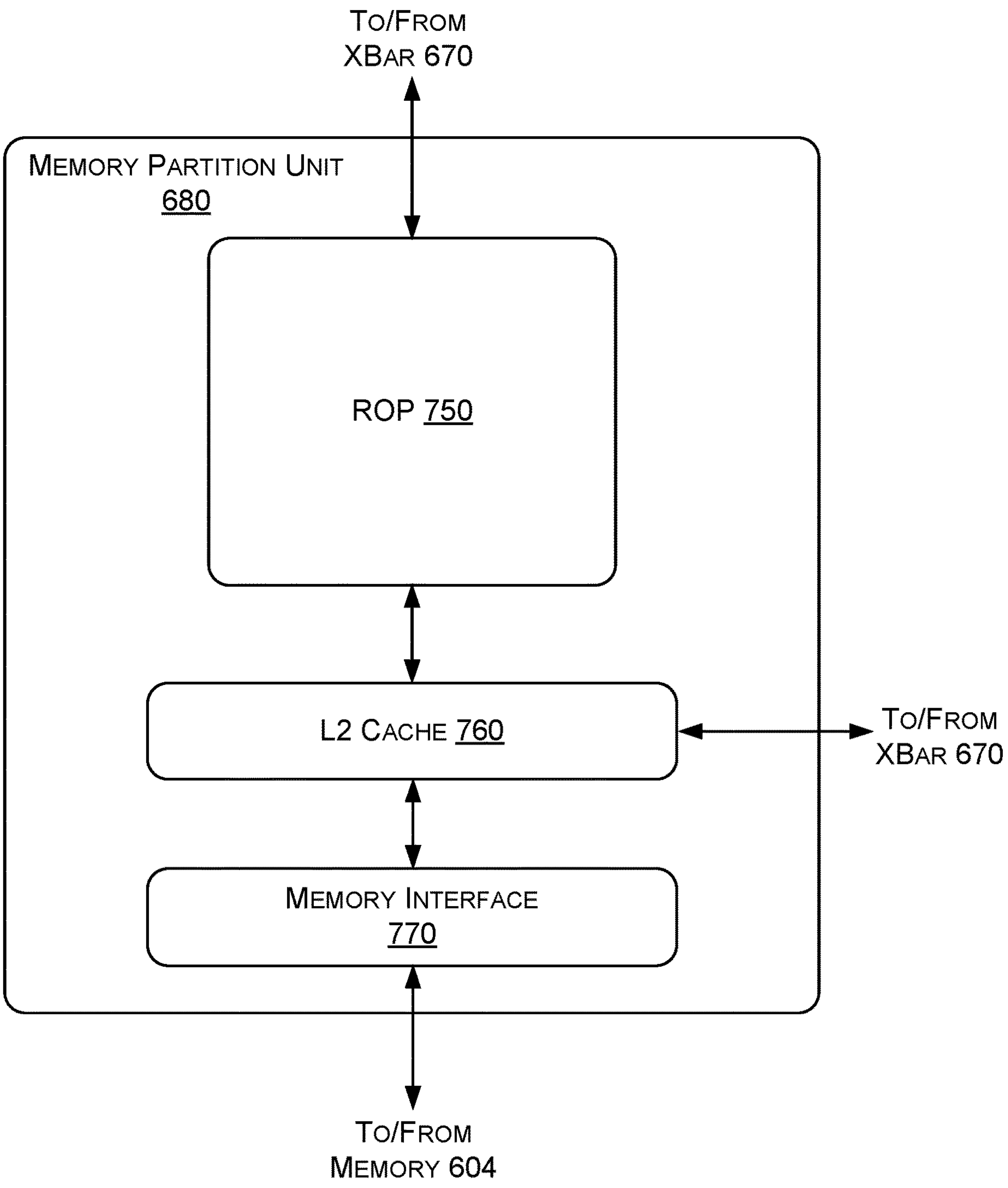
FIG. 7B illustrates an example memory partition unit of the parallel processing unit of FIG. 6 suitable for use in implementing at least some embodiments of the present disclosure.

FIG. 7B illustrates an example memory partition unit 680 of the PPU 600 of FIG. 6 suitable for use in implementing at least some embodiments of the present disclosure. As shown in FIG. 7B, the memory partition unit 680 includes a Raster Operations (ROP) unit 750, a level two (L2) cache 760, and a memory interface 770. The memory interface 770 may be coupled to the memory 604. Memory interface 770 may implement 32, 64, 128, 1024-bit data buses, or the like, for high-speed data transfer. In at least one embodiment, the PPU 600 incorporates U memory interfaces 770, one memory interface 770 per pair of partition units 680, where each pair of partition units 680 is connected to a corresponding memory device 604. For example, the PPU 600 may be connected to up to Y memory devices 604, such as high bandwidth memory stacks or graphics double-data-rate, version 5, synchronous dynamic random access memory, or other types of persistent storage.

In at least one embodiment, the memory interface 770 implements an HBM2 memory interface and Y equals half U. In at least one embodiment, the HBM2 memory stacks are located on the same physical package as the PPU 600, providing substantial power and area savings compared with conventional GDDR5 SDRAM systems. In at least one embodiment, each HBM2 stack includes four memory dies and Y equals 4, with HBM2 stack including two 128-bit channels per die for a total of 8 channels and a data bus width of 1024 bits.

In at least one embodiment, the memory 604 supports Single-Error Correcting Double-Error Detecting (SECDED) Error Correction Code (ECC) to protect data. ECC provides high reliability for compute applications that are sensitive to data corruption. Reliability is especially important in large-scale cluster computing environments where the PPUs 600 process very large datasets and/or run applications for extended periods.

In at least one embodiment, the PPU 600 implements a multi-level memory hierarchy. In at least one embodiment, the memory partition unit 680 supports a unified memory to provide a single unified virtual address space for CPU and PPU 600 memory, enabling data sharing between virtual memory systems. In at least one embodiment the frequency of accesses by a PPU 600 to memory located on other processors is traced to ensure that memory pages are moved to the physical memory of the PPU 600 that is accessing the pages more frequently. In at least one embodiment, the NVLink 610 supports address translation services allowing the PPU 600 to directly access a CPU's page tables and providing full access to CPU memory by the PPU 600.

In at least one embodiment, copy engines transfer data between multiple PPUs 600 or between PPUs 600 and CPUs. The copy engines can generate page faults for addresses that are not mapped into the page tables. The memory partition unit 680 can then service the page faults, mapping the addresses into the page table, after which the copy engine can perform the transfer. With hardware page faulting, addresses can be passed to the copy engines without worrying if the memory pages are resident, and the copy process is transparent.

Data from the memory 604 or other system memory may be fetched by the memory partition unit 680 and stored in the L2 cache 760, which is located on-chip and is shared between the various GPCs 650. As shown, each memory partition unit 680 includes a portion of the L2 cache 760 associated with a corresponding memory device 604. Lower level caches may then be implemented in various units within the GPCs 650. For example, each of the SMs 740 may implement a level one (L1) cache. The L1 cache is private memory that may be dedicated to a particular SM 740. Data from the L2 cache 760 may be fetched and stored in each of the L1 caches for processing in the functional units of the SMs 740. The L2 cache 760 is coupled to the memory interface 770 and the XBar 670.

The ROP unit 750 performs graphics raster operations related to pixel color, such as color compression, pixel blending, and the like. The ROP unit 750 also implements depth testing in conjunction with the raster engine 725, receiving a depth for a sample location associated with a pixel fragment from the culling engine of the raster engine 725. The depth is tested against a corresponding depth in a depth buffer for a sample location associated with the fragment. If the fragment passes the depth test for the sample location, then the ROP unit 750 updates the depth buffer and transmits a result of the depth test to the raster engine 725. It will be appreciated that the number of partition units 680 may be different than the number of GPCs 650 and, therefore, each ROP unit 750 may be coupled to each of the GPCs 650. The ROP unit 750 may track packets received from the different GPCs 650 and determine which GPC 650 that a result generated by the ROP unit 750 is routed to through the Xbar 670. Although the ROP unit 750 is included within the memory partition unit 680 in FIG. 7B, in other examples, the ROP unit 750 may be outside of the memory partition unit 680. For example, the ROP unit 750 may reside in the GPC 650 or another unit.

Figure 8A:
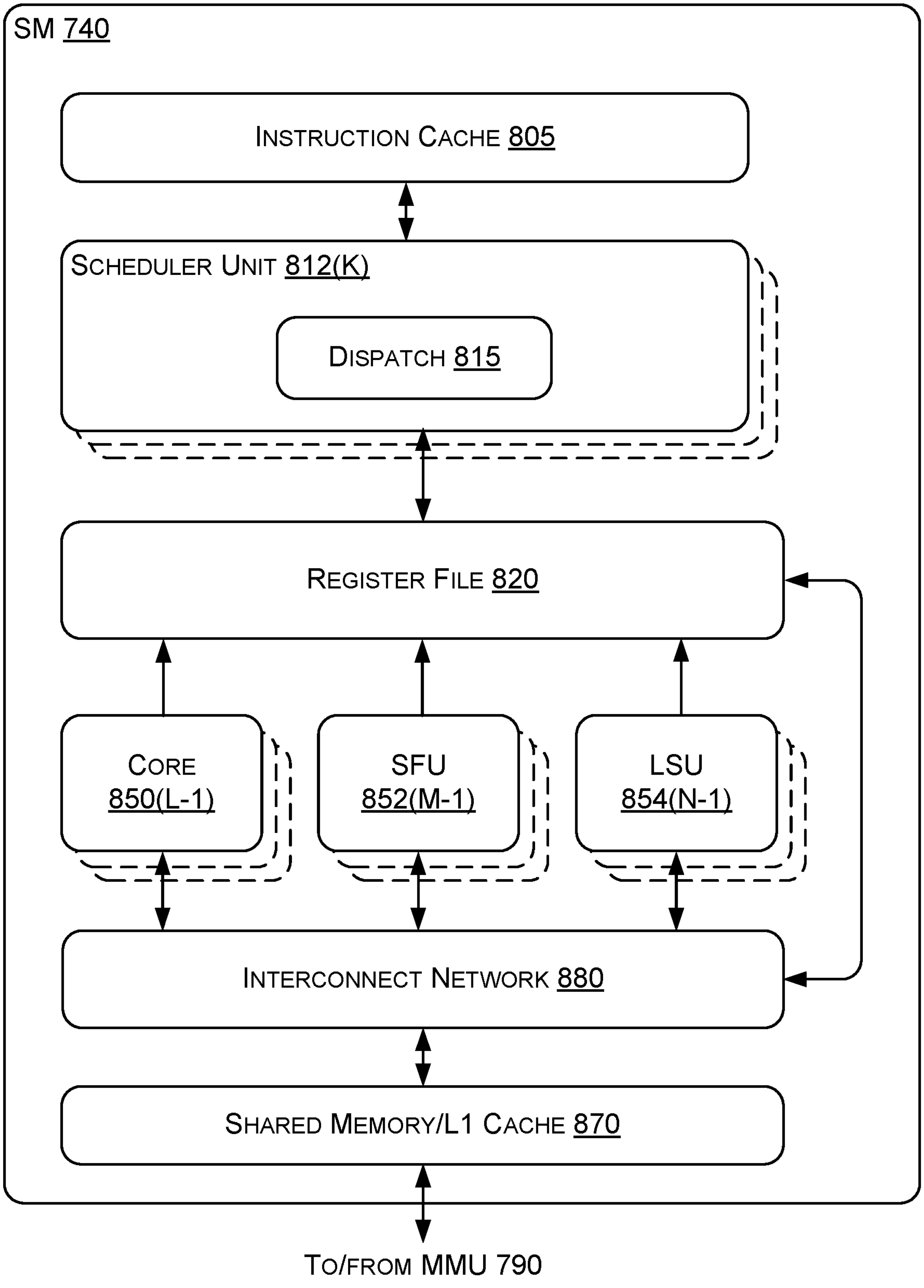
FIG. 8A illustrates an example of the streaming multi-processor of FIG. 7A suitable for use in implementing at least some embodiments of the present disclosure.

FIG. 8A illustrates an example of the streaming multiprocessor 740 of FIG. 7A suitable for use in implementing at least some embodiments of the present disclosure. As shown in FIG. 8A, the SM 740 includes an instruction cache 805, one or more scheduler units 812, a register file 820, one or more processing cores 850, one or more special function units (SFUs) 852, one or more load/store units (LSUs) 854, an interconnect network 880, and a shared memory/L1 cache 870.

As described herein, the work distribution unit 625 dispatches tasks for execution on the GPCs 650 of the PPU 600. The tasks may be allocated to a particular DPC 720 within a GPC 650 and, if the task is associated with a shader program, the task may be allocated to an SM 740. The scheduler unit 812 may receive the tasks from the work distribution unit 625 and manage instruction scheduling for one or more thread blocks assigned to the SM 740. The scheduler unit 812 may schedule thread blocks for execution as warps of parallel threads, where each thread block is allocated at least one warp. In at least one embodiment, each warp executes 32 threads. The scheduler unit 812 may manage a plurality of different thread blocks, allocating the warps to the different thread blocks and then dispatching instructions from the plurality of different cooperative groups to the various functional units (e.g., cores 850, SFUs 852, and LSUs 854) during each clock cycle.

Cooperative Groups may refer to a programming model for organizing groups of communicating threads that allows developers to express the granularity at which threads are communicating, enabling the expression of richer, more efficient parallel decompositions. Cooperative launch APIs may support synchronization amongst thread blocks for the execution of parallel algorithms. Conventional programming models provide a single, simple construct for synchronizing cooperating threads: a barrier across all threads of a thread block (e.g., the syncthreads ( ) function). However, programmers would often like to define groups of threads at smaller than thread block granularities and synchronize within the defined groups to enable greater performance, design flexibility, and software reuse in the form of collective group-wide function interfaces.

Cooperative Groups enables programmers to define groups of threads explicitly at sub-block (e.g., as small as a single thread) and multi-block granularities, and to perform collective operations such as synchronization on the threads in a cooperative group. The programming model supports clean composition across software boundaries, so that libraries and utility functions can synchronize safely within their local context without having to make assumptions about convergence. Cooperative Groups primitives enable new patterns of cooperative parallelism, including producer-consumer parallelism, opportunistic parallelism, and global synchronization across an entire grid of thread blocks.

A dispatch unit 815 may be configured to transmit instructions to one or more of the functional units. In at least one embodiment, the scheduler unit 812 includes two dispatch units 815 that enable two different instructions from the same warp to be dispatched during each clock cycle. In at least embodiment, each scheduler unit 812 may include a single dispatch unit 815 or additional dispatch units 815.

Each SM 740 may include a register file 820 that provides a set of registers for the functional units of the SM 740. In at least one embodiment, the register file 820 is divided between each of the functional units such that each functional unit is allocated a dedicated portion of the register file 820. In at least one embodiment, the register file 820 is divided between the different warps being executed by the SM 740. The register file 820 provides temporary storage for operands connected to the data paths of the functional units.

Each SM 740 may include L processing cores 850. In at least one embodiment, the SM 740 includes a large number (e.g., 128, etc.) of distinct processing cores 850. Each core 850 may include a fully-pipelined, single-precision, double-precision, and/or mixed precision processing unit that includes a floating point arithmetic logic unit and an integer arithmetic logic unit. In at least one embodiment, the floating point arithmetic logic units implement the IEEE 754-2008 standard for floating point arithmetic. In at least one embodiment, the cores 850 include 64 single-precision (32-bit) floating point cores, 64 integer cores, 32 double-precision (64-bit) floating point cores, and 8 tensor cores.

Tensor cores configured to perform matrix operations, and, in at least one embodiment, one or more tensor cores are included in the cores 850. In particular, the tensor cores may be configured to perform deep learning matrix arithmetic, such as convolution operations for neural network training and inferencing. In at least one embodiment, each tensor core operates on a 4×4 matrix and performs a matrix multiply and accumulate operation D=A×B+C, where A, B, C, and D are 4×4 matrices.

Training complex neural networks requires massive amounts of parallel computing performance, including floating-point multiplications and additions that are supported by the PPU 600. Inferencing is less compute-intensive than training, being a latency-sensitive process where a trained neural network is applied to new inputs it has not seen before to classify images, translate speech, and infer new information.

Neural networks rely heavily on matrix math operations, and complex multi-layered networks require tremendous amounts of floating-point performance and bandwidth for both efficiency and speed. With thousands of processing cores, optimized for matrix math operations, and delivering tens to hundreds of TFLOPS of performance, the PPU 600 may form a computing platform capable of delivering performance required for deep neural network-based artificial intelligence and machine learning applications.

In at least one embodiment, the matrix multiply inputs A and B are 16-bit floating point matrices, while the accumulation matrices C and D may be 16-bit floating point or 32-bit floating point matrices. Tensor Cores operate on 16-bit floating point input data with 32-bit floating point accumulation. The 16-bit floating point multiply requires 64 operations and results in a full precision product that is then accumulated using 32-bit floating point addition with the other intermediate products for a 4×4×4 matrix multiply. In practice, Tensor Cores may be used to perform much larger two-dimensional or higher dimensional matrix operations, built up from these smaller elements. An API, such as CUDA 9 C++ API, exposes specialized matrix load, matrix multiply and accumulate, and matrix store operations to efficiently use Tensor Cores from a CUDA-C++ program. At the CUDA level, the warp-level interface assumes 16×16 size matrices spanning all 32 threads of the warp.

Each SM 740 may also include M SFUs 852 that perform special functions (e.g., attribute evaluation, reciprocal square root, and the like). In at least one embodiment, the SFUs 852 may include a tree traversal unit configured to traverse a hierarchical tree data structure. In at least one embodiment, the SFUs 852 may include texture unit configured to perform texture map filtering operations. In at least one embodiment, the texture units are configured to load texture maps (e.g., a 2D array of texels) from the memory 604 and sample the texture maps to produce sampled texture values for use in shader programs executed by the SM 740. In at least one embodiment, the texture maps are stored in the shared memory/L1 cache 770. The texture units implement texture operations such as filtering operations using mip-maps (e.g., texture maps of varying levels of detail). In at least one embodiment, each SM 740 includes two texture units.

Each SM 740 may also include N LSUs 854 that implement load and store operations between the shared memory/L1 cache 870 and the register file 820. Each SM 740 may include an interconnect network 880 that connects each of the functional units to the register file 820 and the LSU 854 to the register file 820, shared memory/L1 cache 870. In at least one embodiment, the interconnect network 880 is a crossbar that can be configured to connect any of the functional units to any of the registers in the register file 820 and connect the LSUs 854 to the register file and memory locations in shared memory/L1 cache 870.

The shared memory/L1 cache 870 may include an array of on-chip memory that allows for data storage and communication between the SM 740 and the primitive engine 735 and between threads in the SM 740. In at least one embodiment, the shared memory/L1 cache 870 comprises 128 KB of storage capacity and is in the path from the SM 740 to the partition unit 680. The shared memory/L1 cache 870 can be used to cache reads and writes. One or more of the shared memory/L1 cache 870, L2 cache 760, and memory 604 may be backing stores.

Combining data cache and shared memory functionality into a single memory block may provide the best overall performance for both types of memory accesses. The capacity may be usable as a cache by programs that do not use shared memory. For example, if shared memory is configured to use half of the capacity, texture and load/store operations can use the remaining capacity. Integration within the shared memory/L1 cache 870 may enable the shared memory/L1 cache 870 to function as a high-throughput conduit for streaming data while simultaneously providing high-bandwidth and low-latency access to frequently reused data.

When configured for general purpose parallel computation, a simpler configuration can be used compared with graphics processing. Specifically, the fixed function graphics processing units shown in FIG. 6, may be bypassed, creating a much simpler programming model. In the general-purpose parallel computation configuration, the work distribution unit 625 may assign and distribute blocks of threads directly to the DPCs 720. The threads in a block may execute the same program, using a unique thread ID in the calculation to ensure each thread generates unique results, using the SM 740 to execute the program and perform calculations, shared memory/L1 cache 870 to communicate between threads, and the LSU 854 to read and write global memory through the shared memory/L1 cache 870 and the memory partition unit 680. When configured for general purpose parallel computation, the SM 740 can also write commands that the scheduler unit 620 can use to launch new work on the DPCs 720.

The PPU 600 may be included in a desktop computer, a laptop computer, a tablet computer, servers, supercomputers, a smart-phone (e.g., a wireless, hand-held device), personal digital assistant (PDA), a digital camera, a vehicle, a head mounted display, a hand-held electronic device, and the like. In at least one embodiment, the PPU 600 is embodied on a single semiconductor substrate. In at least one embodiment, the PPU 600 is included in a system-on-a-chip (SoC) along with one or more other devices such as additional PPUs 600, the memory, a reduced instruction set computer (RISC) CPU, a memory management unit (MMU), a digital-to-analog converter (DAC), and the like.

In at least one embodiment, the PPU 600 may be included on a graphics card that includes one or more memory devices 604. The graphics card may be configured to interface with a PCIe slot on a motherboard of a desktop computer. In at least one embodiment, the PPU 600 may be an integrated graphics processing unit (iGPU) or parallel processor included in the chipset of the motherboard.

Example of a Computing System

Systems with multiple GPUs and CPUs are used in a variety of industries as developers expose and use more parallelism in applications such as artificial intelligence computing. High-performance GPU-accelerated systems with tens to many thousands or more of compute nodes are deployed in data centers, research facilities, and supercomputers to solve ever larger problems. As the number of processing devices within the high-performance systems increases, the communication and data transfer mechanisms need to scale to support the increased bandwidth.

Figure 8B:
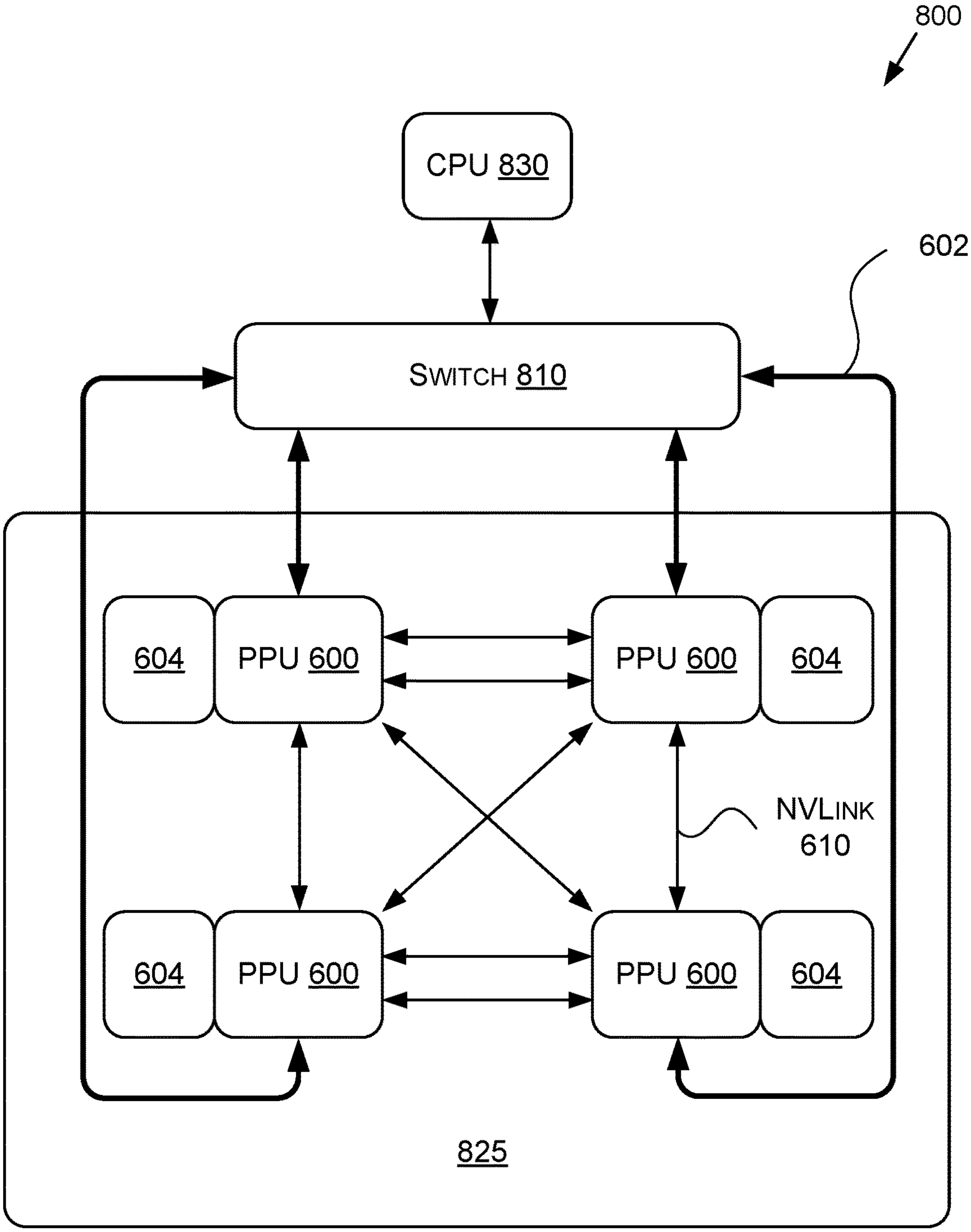
FIG. 8B is an example conceptual diagram of a processing system implemented using the PPU of FIG. 6 suitable for use in implementing at least some embodiments of the present disclosure.

FIG. 8B is an example conceptual diagram of a processing system 800 implemented using the PPU 600 of FIG. 6 suitable for use in implementing at least some embodiments of the present disclosure. The processing system 800 includes a CPU 830, switch 810, and multiple PPUs 600 each and respective memories 604. The NVLink 610 provides high-speed communication links between each of the PPUs 600. Although a particular number of NVLink 610 and interconnect 602 connections are illustrated in FIG. 8B, the number of connections to each PPU 600 and the CPU 830 may vary. The switch 810 interfaces between the interconnect 602 and the CPU 830. The PPUs 600, memories 604, and NVLinks 610 may be situated on a single semiconductor platform to form a parallel processing system 825. In at least one embodiment, the switch 810 supports two or more protocols to interface between various different connections and/or links.

In at least embodiment (not shown), the NVLink 610 provides one or more high-speed communication links between each of the PPUs 600 and the CPU 830 and the switch 810 interfaces between the interconnect 602 and each of the PPUs 600. The PPUs 600, memories 604, and interconnect 602 may be situated on a single semiconductor platform to form a parallel processing module 825. In at least one embodiment (not shown), the interconnect 602 provides one or more communication links between each of the PPUs 600 and the CPU 830 and the switch 810 interfaces between each of the PPUs 600 using the NVLink 610 to provide one or more high-speed communication links between the PPUs 600. In at least one embodiment (not shown), the NVLink 610 provides one or more high-speed communication links between the PPUs 600 and the CPU 830 through the switch 810. In yet at least one embodiment (not shown), the interconnect 602 provides one or more communication links between each of the PPUs 600 directly. One or more of the NVLink 610 high-speed communication links may be implemented as a physical NVLink interconnect or either an on-chip or on-die interconnect using the same protocol as the NVLink 610.

In the context of the present description, a single semiconductor platform may refer to a sole unitary semiconductor-based integrated circuit fabricated on a die or chip. The term single semiconductor platform may also refer to multi-chip modules with increased connectivity which simulate on-chip operation and make substantial improvements over using a conventional bus implementation. Of course, the various circuits or devices may also be situated separately or in various combinations of semiconductor platforms per the desires of the user. Alternately, the parallel processing module 825 may be implemented as a circuit board substrate and each of the PPUs 600 and/or memories 604 may be packaged devices. In at least one embodiment, the CPU 830, switch 810, and the parallel processing module 825 are situated on a single semiconductor platform.

In at least one embodiment, the signaling rate of each NVLink 610 is 20 to 25 Gigabits/second and each PPU 600 includes six NVLink 610 interfaces (as shown in FIG. 8B, five NVLink 610 interfaces are included for each PPU 600). Each NVLink 610 may provide a data transfer rate of 25 Gigabytes/second in each direction, with six links providing 600 Gigabytes/second. The NVLinks 610 can be used exclusively for PPU-to-PPU communication as shown in FIG. 8B, or some combination of PPU-to-PPU and PPU-to-CPU, when the CPU 830 also includes one or more NVLink 610 interfaces.

In at least one embodiment, the NVLink 610 allows direct load/store/atomic access from the CPU 830 to each PPU's 600 memory 604. In at least one embodiment, the NVLink 610 supports coherency operations, allowing data read from the memories 604 to be stored in the cache hierarchy of the CPU 830, reducing cache access latency for the CPU 830. In at least one embodiment, the NVLink 610 includes support for Address Translation Services (ATS), allowing the PPU 600 to directly access page tables within the CPU 830. One or more of the NVLinks 610 may also be configured to operate in a low-power mode.

Figure 8C:
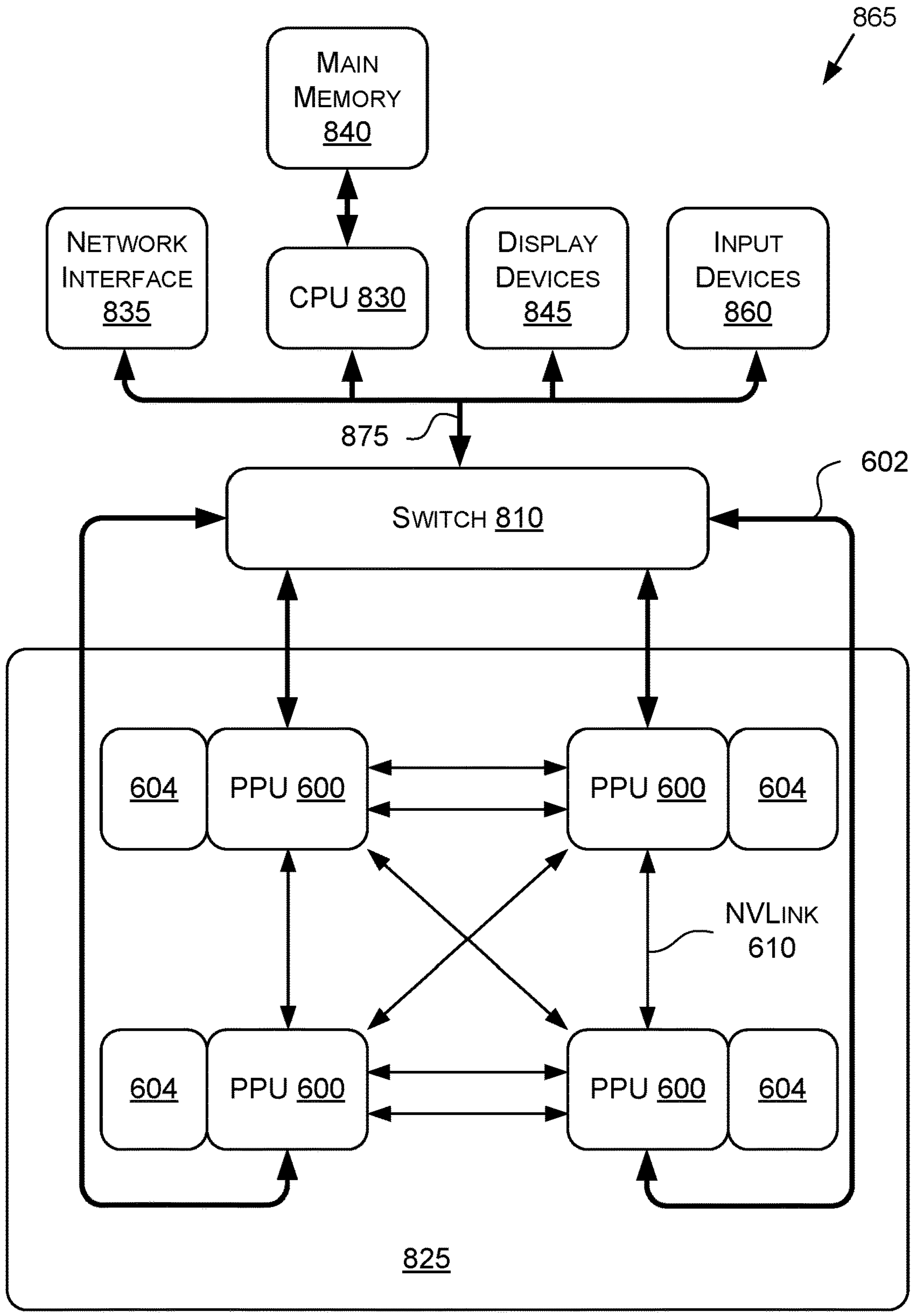
FIG. 8C illustrates an example system in which the various architecture and/or functionality of the various embodiments may be implemented.

FIG. 8C illustrates an example system 865 in which the various architecture and/or functionality of the various previous embodiments may be implemented suitable for use in implementing at least some embodiments of the present disclosure.

As shown, a system 865 is provided including at least one central processing unit 830 that is connected to a communication bus 875. The communication bus 875 may be implemented using any suitable protocol, such as PCI (Peripheral Component Interconnect), PCI-Express, AGP (Accelerated Graphics Port), HyperTransport, or any other bus or point-to-point communication protocol(s). The system 865 also includes a main memory 840. Control logic (software) and data are stored in the main memory 840 which may take the form of random access memory (RAM).

The system 865 also includes input devices 860, the parallel processing system 825, and display devices 845, e.g. a conventional CRT (cathode ray tube), LCD (liquid crystal display), LED (light emitting diode), plasma display or the like. User input may be received from the input devices 860, e.g., keyboard, mouse, touchpad, microphone, and the like. Each of the foregoing modules and/or devices may even be situated on a single semiconductor platform to form the system 865. Alternately, the various modules may also be situated separately or in various combinations of semiconductor platforms per the desires of the user.

Further, the system 865 may be coupled to a network (e.g., a telecommunications network, local area network (LAN), wireless network, wide area network (WAN) such as the Internet, peer-to-peer network, cable network, or the like) through a network interface 835 for communication purposes.

The system 865 may also include a secondary storage (not shown). The secondary storage may include, for example, a hard disk drive and/or a removable storage drive, representing a floppy disk drive, a magnetic tape drive, a compact disk drive, digital versatile disk (DVD) drive, recording device, universal serial bus (USB) flash memory. The removable storage drive may read from and/or writes to a removable storage unit.

Computer programs, or computer control logic algorithms, may be stored in the main memory 840 and/or the secondary storage. Such computer programs, when executed, enable the system 865 to perform various functions. The memory 840, the storage, and/or any other storage are possible examples of computer-readable media.

The architecture and/or functionality of the various previous figures may be implemented in the context of a general computer system, a circuit board system, a game console system dedicated for entertainment purposes, an application-specific system, and/or any other desired system. For example, the system 865 may take the form of a desktop computer, a laptop computer, a tablet computer, servers, supercomputers, a smart-phone (e.g., a wireless, hand-held device), personal digital assistant (PDA), a digital camera, a vehicle, a head mounted display, a hand-held electronic device, a mobile phone device, a television, workstation, game consoles, embedded system, and/or any other type of logic.

Ray Tracing Pipeline

In at least one embodiment, the PPU 600 comprises a graphics processing unit (GPU). The PPU 600 may be configured to receive commands that specify shader programs for processing graphics data. Graphics data may be defined as a set of primitives such as points, lines, triangles, quads, triangle strips, and the like. A primitive may include data that specifies a number of vertices for the primitive (e.g., in a model-space coordinate system) as well as attributes associated with each vertex of the primitive. The PPU 600 may be configured to process the graphics primitives to generate a frame buffer (e.g., pixel data for each of the pixels of the display).

An application may write model data for a scene (e.g., a collection of vertices and attributes) to a memory such as a system memory or memory 604. The model data may define each of the objects that may be visible on a display. The application may then make an API call to the driver kernel that requests the model data to be rendered and displayed. The driver kernel may read the model data and write commands to the one or more streams to perform operations to process the model data. The commands may reference different shader programs to be implemented on the SMs 740 of the PPU 600. For example, different SMs 740 may be configured to execute different shader programs.

In at least one embodiment, the model data may be processed to perform one or more ray tracing operations, such as real-time tray tracing, to render the model data to a frame buffer. The contents of the frame buffer may be transmitted to a display controller for display on a display device. Ray tracing may refer to any of a variety of techniques for modeling or simulating light transport and/or other aspects of an environment, for example, for use in generating digital images or otherwise simulating the environment. Thus, while certain embodiments may be described with respect to light transport simulation, they may be applicable to simulating, modeling, and/or measuring any of a variety of aspects of an environment. Non-limiting examples of ray tracing include ray casting, recursive ray tracing, distribution ray tracing, photon mapping, and path tracing.

Ray tracing may be used to simulate a variety of optical effects-such as shadows, reflections, refractions, scattering phenomenon, ambient occlusions, global illuminations, or dispersion phenomenon (such as chromatic aberration). Ray tracing may involve generating ray-traced samples by casting rays in a virtual environment to sample lighting and/or other environmental conditions for pixels. The ray traced samples may be combined and used to determine pixel colors for an image. In at least one embodiment, to conserve computing resources, the lighting conditions may be sparsely sampled, resulting in noisy render data. Temporal accumulation may be used to increase the effective sample count by using information from previous frames. To produce a final render that approximates a render of a fully sampled scene, one or more denoising filters may by be applied to the noisy render data to reduce noise.

Many ray tracing algorithms may cast or shoot rays from a virtual camera, or eye, through a 2D viewing plane (e.g., a pixel plane) out into a 3D scene which may include one or more light sources. Some rays may directly reach the viewing plane from a light source, some may be blocked by an object in the scene causing shadows, and some may reflect or refract off an object before reaching the viewing plane. When the rays intersect objects, the color and lighting information at the points of intersection on object surfaces may contribute to various pixel color and illumination levels of pixels of the viewing plane. Different objects may have different surface properties that can cause them to reflect, refract, or absorb light in different ways, which may be accounted for in ray tracing. Rays may reflect off objects and hit other objects, or travel through the surfaces of transparent objects before reaching a light source, and the color and lighting information from all the intersected objects may contribute to the final pixel colors.

Figure 9:
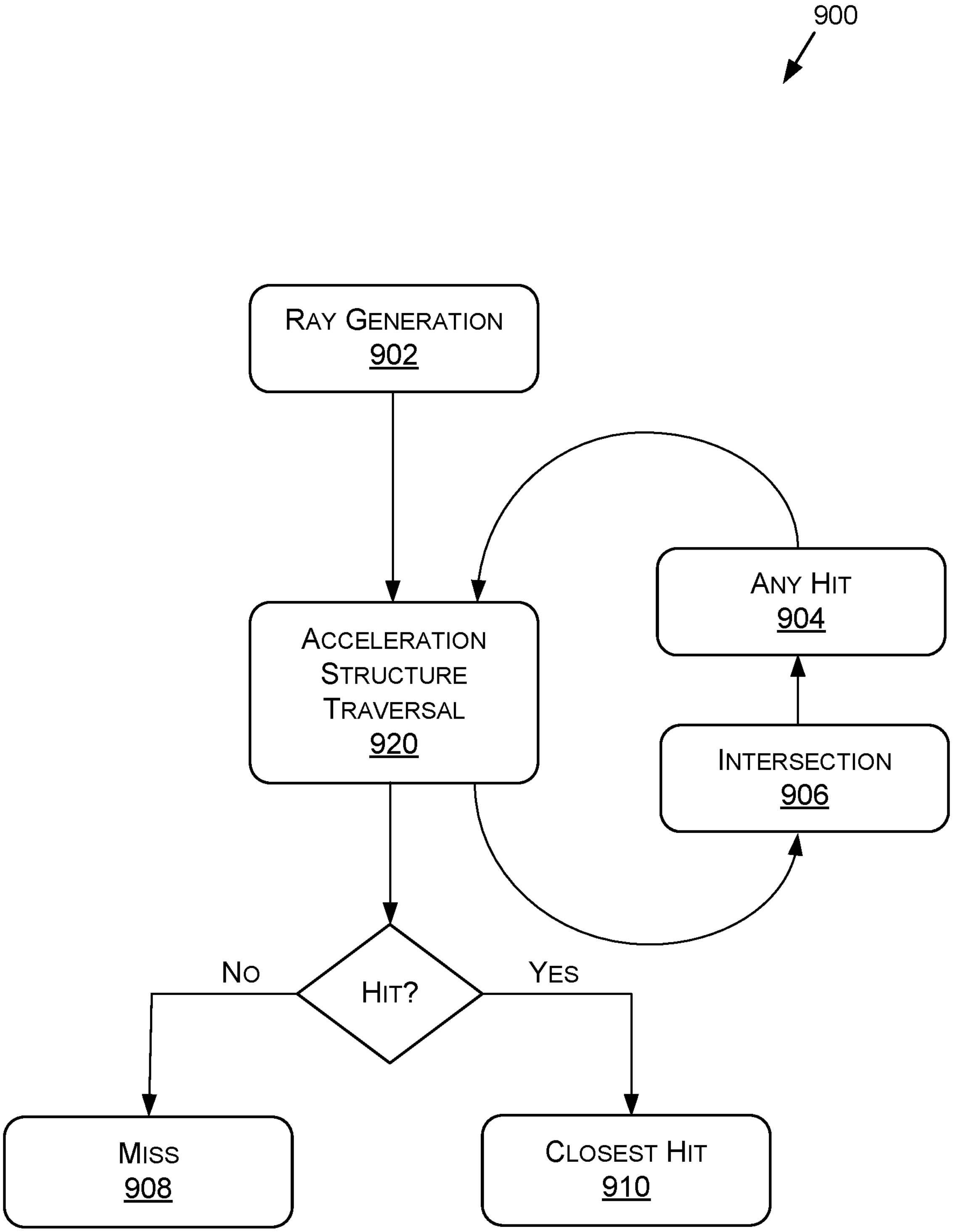
FIG. 9 illustrates an example ray tracing pipeline suitable for use in implementing at least some embodiments of the present disclosure.

FIG. 9 illustrates an example ray tracing pipeline 900 suitable for use in implementing at least some embodiments of the present disclosure. By way of example, and not limitations, the ray tracing pipeline 900 may be implemented by the PPU 600 of FIG. 6, in accordance with at least one embodiment. The ray tracing pipeline 900 may include processing steps implemented to generate 2D computer-generated images from 3D geometry data using one or more ray tracing techniques.

In at least one embodiment, the ray tracing pipeline 900 may be constructed using one or more ray generation shaders 902, one or more any hit shaders 904, one or more intersection shaders 906, one or more miss shaders 908, and/or one or more closest hit shaders 910.

The ray tracing pipeline 900 may be implemented via an application executed by a host processor, such as a CPU. In at least one embodiment, a device driver may implement an application programming interface (API) that defines various functions that can be used by an application in order to generate graphical data for display. The device driver may refer to a software program that includes instructions that control the operation of the PPU 600, or other PPU used to implement the ray tracing pipeline 900. The API may provide an abstraction for a programmer that lets a programmer use specialized graphics hardware, such as the PPU 600, to generate the graphical data without requiring the programmer to use the specific instruction set for the PPU 600. The application may include an API call that is routed to the device driver for the PPU 600. The device driver may interpret the API call and perform various operations to respond to the API call. In at least one embodiment, the device driver performs operations by executing instructions on the CPU. In at least one embodiment, the device driver performs operations, at least in part, by launching operations on the PPU 600 using an input/output interface between the CPU and the PPU 600. In at least one embodiment, the device driver is configured to implement the ray tracing pipeline 900 using the hardware of the PPU 600.

Various programs may be executed within the PPU 600 in order to implement the various stages of the ray tracing pipeline 900. For example, the device driver may launch a kernel on the PPU 600 to execute a stage implementing a ray generation shader 902 on an SM 740 (or multiple SMs 740). The device driver (or the initial kernel executed by the PPU 600) may also launch other kernels on the PPU 600 to execute other stages of the ray tracing pipeline 900.

The ray generation shader 902 may be the first shader involved in ray tracing dispatch. The ray generation shader 902 may call a High Level Shader Language (HLSL) function called TraceRay( ) This TraceRay( ) function may cast a single ray into the scene to search for intersections, which may trigger other shaders in the process. In at least one embodiment, the ray generation shader 902 may call TraceRay( ) any number of times.

An any hit shader 904 and an intersection shader 906 may be invoked whenever TraceRay( ) finds a potential intersection between the ray and the scene. The intersection shader 906 may determine whether the ray intersects an individual geometric primitive—for example a sphere, a subdivision surface, a triangle, or other form of primitive. Once an intersection is found, the any hit shader 904 may be used to process the intersection further or potentially discard the intersection. An any hit shader 904 may, by way of example and not limitation, use alpha testing by performing a texture lookup and deciding based on the texel's value whether or not to discard an intersection.

Once TraceRay( ) has completed the search for ray-scene intersections, either a miss shader 908 or a closest hit shader 910 may be invoked, depending on the outcome of the search. The closest hit shader 910 may perform most shading operations, such as, material evaluation, texture lookups, and so on. The miss shader 908 may be used to implement environment lookups, for example. In at least one embodiment, one or more of the closest hit shader 910 or the miss shader 908 may recursively trace rays by calling TraceRay ( ) themselves.

The ray tracing pipeline 900 constructed from any of the various shaders described herein may define a single-ray programming model. In at least one embodiment, each thread of the PPU 600, and/or other PPU used to implement the ray tracing pipeline 900, may handle one ray at a time. In at least one embodiment, each thread cannot communicate with other threads or see other rays currently being processed. This may simplify shader code, while allowing for vendor-specific optimizations using the API.

In at least one embodiment, different shaders and/or shader types may communicate with each other using a ray payload. A ray payload may refer to a user-defined struct that's passed as an INOUT parameter to TraceRay( ) For example, an any hit shader 904, a closest hit shader 910, and/or a miss shader 908 may read from and/or write to the ray payload, and therefore pass back the result of their computations to the caller of TraceRay( ).

In at least one embodiment, a ray generation shader 902 may trace primary rays, which may include rays being sent into the scene originating from a virtual camera. However, ray generation shaders 902 are not limited to this functionality. In at least one embodiment, a ray generation shader 902 may base ray generation on rasterized g-buffer data (e.g., to trace reflections). Using this approach, ray tracing may be used to complement rasterization, rather than replace rasterization.

When using traditional rasterization, only the shaders required by the current object being drawn may have to be active on the PPU. This may allow rasterization pipeline objects to be relatively small, containing a single set of vertex shaders, pixel shaders, etc. In contrast, a ray tracing pipeline 900 may be used to arbitrarily shoot rays into the scene. This may mean the rays could hit any object or many objects in the scene. Therefore, it may be the case that all shaders for all objects could potentially be hit and therefore it may be desirable for the shaders to all be resident on the PPU and ready for execution.

In at least one embodiment, a state object may be used to group shaders together for execution. At a high level, a state object of a ray tracing pipeline 900 may be seen as a binary executable resulting from a link step across all the shaders compiled for the scene. The relationship between different shaders may be specified at state object creation. For example, triplets of intersection shaders 906, any hit shaders 904, and/or closest hit shaders 910 may be bundled into hit groups. The application may specify the state object of the ray tracing pipeline 900 to be executed when calling a DispatchRays( ) function on a command list. A DispatchRays( ) function may invoke a ray generation shader 902 for each pixel for an image. In at least one embodiment, an application may create any number of state objects for a ray tracing pipeline 900 and may re-use precompiled shaders for this purpose.

Figure 10:
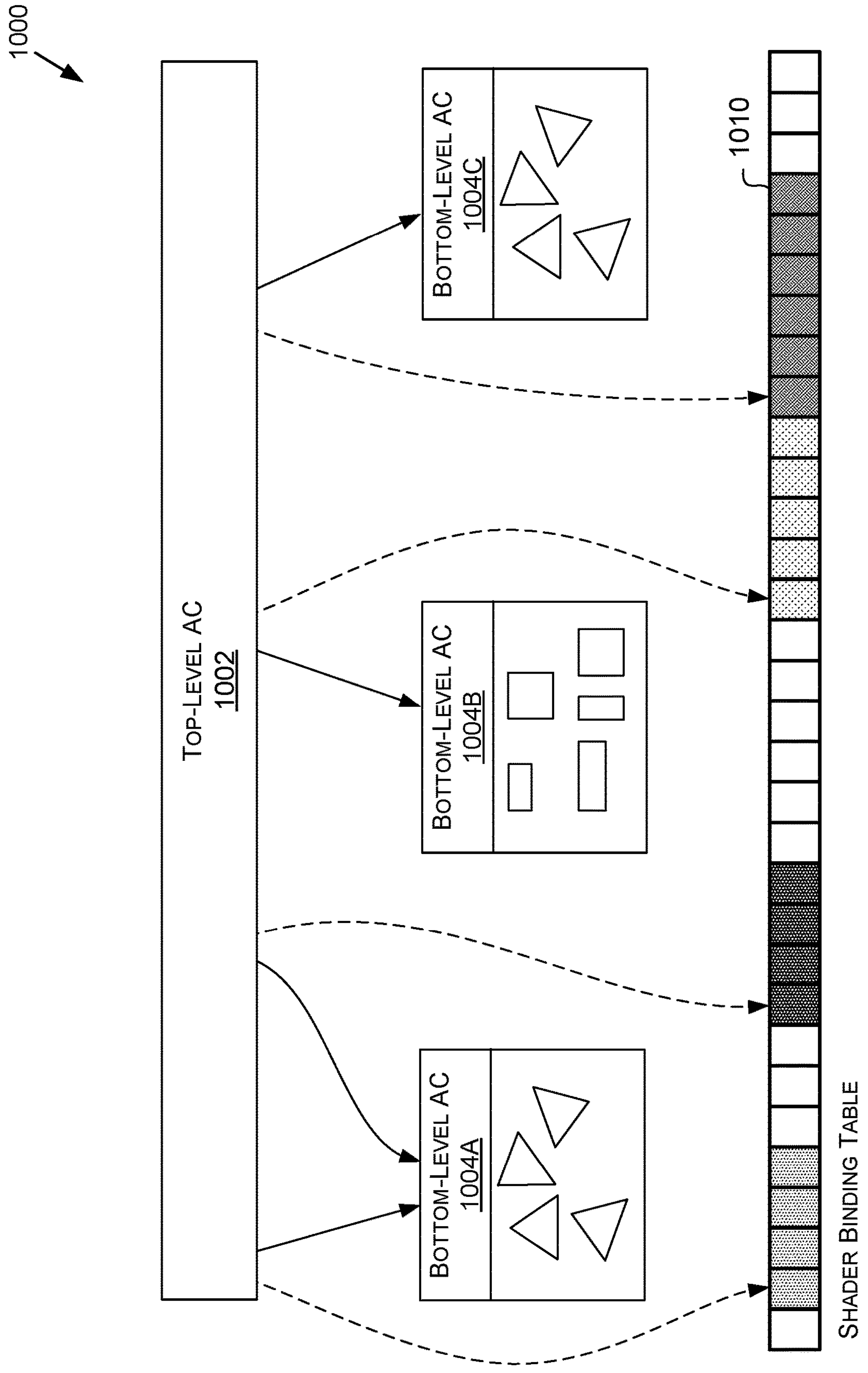
FIG. 10 illustrates an example acceleration structure suitable for use in implementing at least some embodiments of the present disclosure.

Referring now to FIG. 10, FIG. 10 illustrates an example acceleration structure 1000 suitable for use in implementing at least some embodiments of the present disclosure. The acceleration structure 1000 includes one or more top-level acceleration structures, such as a top-level acceleration structure 1002, and one or more bottom-level acceleration structures, such as bottom-level acceleration structures 1004A, 1004B, and 1004C.

The acceleration structure 1000 may comprise a spatial search data structure used in a ray tracing pipeline 900 for acceleration structure traversal 920 to efficiently compute intersections of rays with scene geometry. In at least one embodiment, the application may build an acceleration structure 1000 explicitly using a command list method BuildRaytracingAccelerationStructure( ) In at least one embodiment, the application may optimize an acceleration structure 1000 for different types of content, such as static versus animated content.

A top-level acceleration structure 1002 may be built from one or more references to one or more bottom-level acceleration structures 1004A, 1004B, and/or 1004C. These references may be referred to as instance descriptors. Each instance descriptor may include a transformation matrix to position the instance descriptor in the scene, and an offset into a shader table 1010 (which may also be referred to as a "shader binding table") to locate material information. In at least one embodiment, a top-level acceleration structure 1002 may be used as a scene parameter provided to TraceRay( ) in a ray generation shader 902, and may represent an entry point of the intersection search.

A ray tracing pipeline 900 may specify the shaders that exist in a scene and an acceleration structure 1000 may specify geometry for the scene. The shader table 1010 may refer to a data structure used to tie the geometry to the shaders. For example, the shader table 1010 may define which shader is associated with which object in the scene. In addition, the shader table 1010 may hold information about the resources accessed by each shader, such as textures, buffers, and constants.

A shader table 1010 may comprise a chunk of PPU memory, which may be managed by the application. The application may be responsible for allocating the resource, filling the shader table 1010 with valid data, transferring it to the PPU, and correctly synchronizing the shader table 1010 with ray tracing dispatches. The application may also maintain multiple shader tables 1010, and, for example, multi-buffer them to update one copy while using another for rendering.

A shader table 1010 may comprise an array of equal-sized shader records. Each shader record may associate a shader (or a hit group) with a set of resources. In at least one embodiment, there may exist one record per geometry object in the scene, and a shader table 1010 may include thousands of entries or more.

Figure 11:
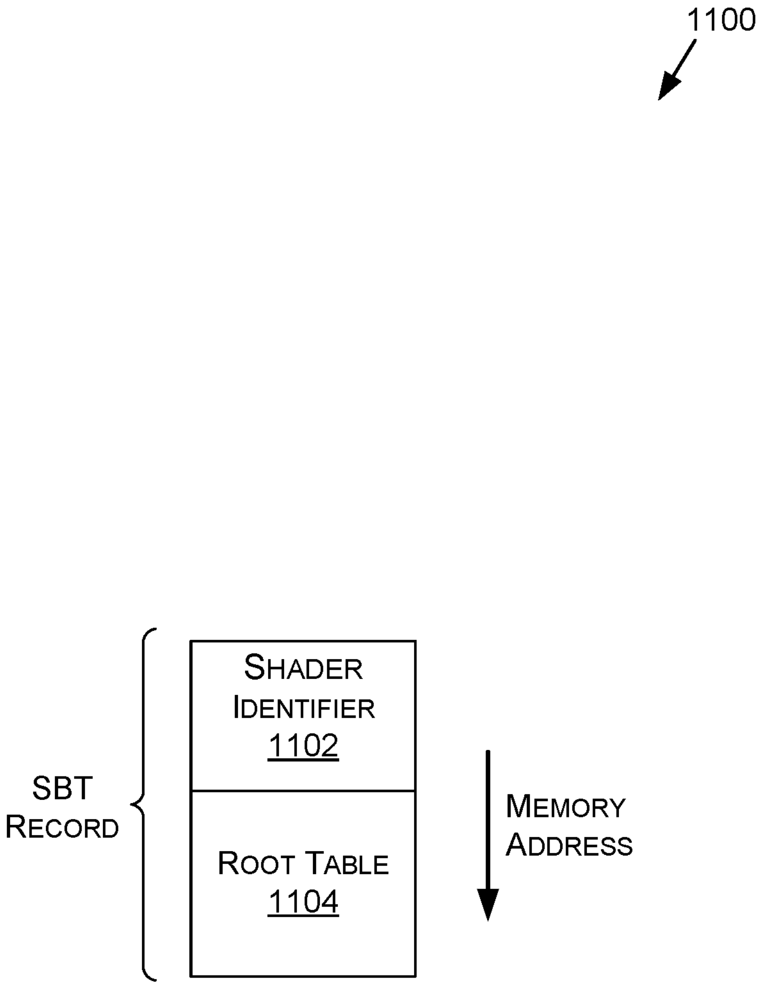
FIG. 11 illustrates an example shader record suitable for use in implementing at least some embodiments of the present disclosure.

Referring now to FIG. 11, FIG. 11 illustrates an example shader record 1100 suitable for use in implementing at least some embodiments of the present disclosure. The shader record 1100 is an example of a shader record that may be included in the shader table 1010 of FIG. 10. The shader record 1100 includes a shader identifier 1102 and a root table 1104.

In at least one embodiment, the shader identifier 1102 may be represented in a beginning portion of the shader record 1100 in memory. The shader identifier 1102 may be an opaque identifier, which the application obtains by querying for the shader identifier 1102 from a compiled shader. The root table 1104 may contain the shader's resources. The layout of the root table 1104 may be defined by the shader's local root signature. The root signature may contain any combination of constants, descriptor tables, and root descriptors. For ray tracing, the application may directly access the root table 1104 in memory (e.g., rather than using "setter" methods), which may allow for efficient updates. In at least one embodiment, a shader table 1010 may be updated from a PPU shader.

As described herein, shader table offsets may be used when building a top-level acceleration structure 1002 from instance descriptors. The system may use these offsets to locate the correct shader record 1100 whenever TraceRay( ) finds an intersection. The system may then bind the resources defined in the shader record 1100 and execute the appropriate shader for the intersected geometry.

Example Computing Device

Figure 12:
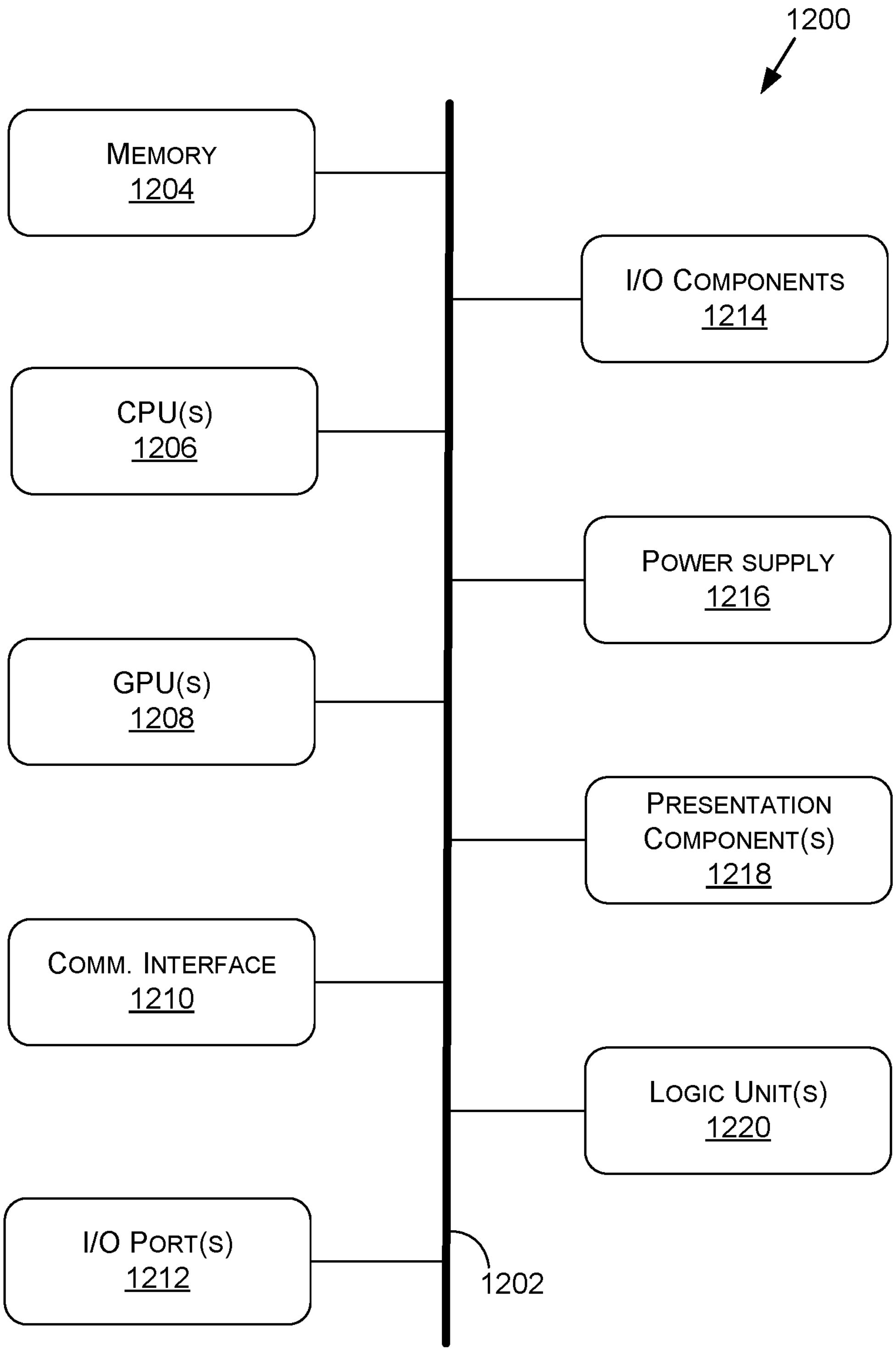
FIG. 12 is a block diagram of an example computing device suitable for use in implementing some embodiments of the present disclosure.

FIG. 12 is a block diagram of an example computing device(s) 1200 suitable for use in implementing at least some embodiments of the present disclosure. Computing device 1200 may include an interconnect system 1202 that directly or indirectly couples the following devices: memory 1204, one or more central processing units (CPUs) 1206, one or more graphics processing units (GPUs) 1208, a communication interface 1210, input/output (I/O) ports 1212, input/output components 1214, a power supply 1216, one or more presentation components 1218 (e.g., display(s)), and one or more logic units 1220. In at least one embodiment, the computing device(s) 1200 may comprise one or more virtual machines (VMs), and/or any of the components thereof may comprise virtual components (e.g., virtual hardware components). For non-limiting examples, one or more of the GPUs 1208 may comprise one or more pups, one or more of the CPUs 1206 may comprise one or more vCPUs, and/or one or more of the logic units 1220 may comprise one or more virtual logic units. As such, a computing device(s) 1200 may include discrete components (e.g., a full GPU dedicated to the computing device 1200), virtual components (e.g., a portion of a GPU dedicated to the computing device 1200), or a combination thereof.

Although the various blocks of FIG. 12 are shown as connected via the interconnect system 1202 with lines, this is not intended to be limiting and is for clarity only. For example, in some embodiments, a presentation component 1218, such as a display device, may be considered an I/O component 1214 (e.g., if the display is a touch screen). As another example, the CPUs 1206 and/or GPUs 1208 may include memory (e.g., the memory 1204 may be representative of a storage device in addition to the memory of the GPUs 1208, the CPUs 1206, and/or other components). In other words, the computing device of FIG. 12 is merely illustrative. Distinction is not made between such categories as "workstation," "server," "laptop," "desktop," "tablet," "client device," "mobile device," "hand-held device," "game console," "electronic control unit (ECU)," "virtual reality system," and/or other device or system types, as all are contemplated within the scope of the computing device of FIG. 12.

The interconnect system 1202 may represent one or more links or busses, such as an address bus, a data bus, a control bus, or a combination thereof. The interconnect system 1202 may include one or more bus or link types, such as an industry standard architecture (ISA) bus, an extended industry standard architecture (EISA) bus, a video electronics standards association (VESA) bus, a peripheral component interconnect (PCI) bus, a peripheral component interconnect express (PCIe) bus, and/or another type of bus or link. In some embodiments, there are direct connections between components. As an example, the CPU 1206 may be directly connected to the memory 1204. Further, the CPU 1206 may be directly connected to the GPU 1208. Where there is direct, or point-to-point connection between components, the interconnect system 1202 may include a PCIe link to carry out the connection. In these examples, a PCI bus need not be included in the computing device 1200.

The memory 1204 may include any of a variety of computer-readable media. The computer-readable media may be any available media that may be accessed by the computing device 1200. The computer-readable media may include both volatile and nonvolatile media, and removable and non-removable media. By way of example, and not limitation, the computer-readable media may comprise computer-storage media and communication media.

The computer-storage media may include both volatile and nonvolatile media and/or removable and non-removable media implemented in any method or technology for storage of information such as computer-readable instructions, data structures, program modules, and/or other data types. For example, the memory 1204 may store computer-readable instructions (e.g., that represent a program(s) and/or a program element(s), such as an operating system. Computer-storage media may include, but is not limited to, RAM, ROM, EEPROM, flash memory or other memory technology, CD-ROM, digital versatile disks (DVD) or other optical disk storage, magnetic cassettes, magnetic tape, magnetic disk storage or other magnetic storage devices, or any other medium which may be used to store the desired information and which may be accessed by computing device 1200. As used herein, computer storage media does not comprise signals per se.

The computer storage media may embody computer-readable instructions, data structures, program modules, and/or other data types in a modulated data signal such as a carrier wave or other transport mechanism and includes any information delivery media. The term "modulated data signal" may refer to a signal that has one or more of its characteristics set or changed in such a manner as to encode information in the signal. By way of example, and not limitation, the computer storage media may include wired media such as a wired network or direct-wired connection, and wireless media such as acoustic, RF, infrared and other wireless media. Combinations of any of the above should also be included within the scope of computer-readable media.

The CPU(s) 1206 may be configured to execute at least some of the computer-readable instructions to control one or more components of the computing device 1200 to perform one or more of the methods and/or processes described herein. The CPU(s) 1206 may each include one or more cores (e.g., one, two, four, eight, twenty-eight, seventy-two, etc.) that are capable of handling a multitude of software threads simultaneously. The CPU(s) 1206 may include any type of processor, and may include different types of processors depending on the type of computing device 1200 implemented (e.g., processors with fewer cores for mobile devices and processors with more cores for servers). For example, depending on the type of computing device 1200, the processor may be an Advanced RISC Machines (ARM) processor implemented using Reduced Instruction Set Computing (RISC) or an x86 processor implemented using Complex Instruction Set Computing (CISC). The computing device 1200 may include one or more CPUs 1206 in addition to one or more microprocessors or supplementary co-processors, such as math co-processors.

In addition to or alternatively from the CPU(s) 1206, the GPU(s) 1208 may be configured to execute at least some of the computer-readable instructions to control one or more components of the computing device 1200 to perform one or more of the methods and/or processes described herein. One or more of the GPU(s) 1208 may be an integrated GPU (e.g., with one or more of the CPU(s) 1206 and/or one or more of the GPU(s) 1208 may be a discrete GPU. In embodiments, one or more of the GPU(s) 1208 may be a coprocessor of one or more of the CPU(s) 1206. The GPU(s) 1208 may be used by the computing device 1200 to render graphics (e.g., 3D graphics) or perform general purpose computations. For example, the GPU(s) 1208 may be used for General-Purpose computing on GPUs (GPGPU). The GPU(s) 1208 may include hundreds or thousands of cores that are capable of handling hundreds or thousands of software threads simultaneously. The GPU(s) 1208 may generate pixel data for output images in response to rendering commands (e.g., rendering commands from the CPU(s) 1206 received via a host interface). The GPU(s) 1208 may include graphics memory, such as display memory, for storing pixel data or any other suitable data, such as GPGPU data. The display memory may be included as part of the memory 1204. The GPU(s) 1208 may include two or more GPUs operating in parallel (e.g., via a link). The link may directly connect the GPUs (e.g., using NVLINK) or may connect the GPUs through a switch (e.g., using NVSwitch). When combined together, each GPU 1208 may generate pixel data or GPGPU data for different portions of an output or for different outputs (e.g., a first GPU for a first image and a second GPU for a second image). Each GPU may include its own memory, or may share memory with other GPUs.

In addition to or alternatively from the CPU(s) 1206 and/or the GPU(s) 1208, the logic unit(s) 1220 may be configured to execute at least some of the computer-readable instructions to control one or more components of the computing device 1200 to perform one or more of the methods and/or processes described herein. In embodiments, the CPU(s) 1206, the GPU(s) 1208, and/or the logic unit(s) 1220 may discretely or jointly perform any combination of the methods, processes and/or portions thereof. One or more of the logic units 1220 may be part of and/or integrated in one or more of the CPU(s) 1206 and/or the GPU(s) 1208 and/or one or more of the logic units 1220 may be discrete components or otherwise external to the CPU(s) 1206 and/or the GPU(s) 1208. In embodiments, one or more of the logic units 1220 may be a coprocessor of one or more of the CPU(s) 1206 and/or one or more of the GPU(s) 1208.

Examples of the logic unit(s) 1220 include one or more processing cores and/or components thereof, such as Data Processing Units (DPUs), Tensor Cores (TCs), Tensor Processing Units (TPUs), Pixel Visual Cores (PVCs), Vision Processing Units (VPUs), Graphics Processing Clusters (GPCs), Texture Processing Clusters (TPCs), Streaming Multiprocessors (SMs), Tree Traversal Units (TTUs), Artificial Intelligence Accelerators (AIAs), Deep Learning Accelerators (DLAs), Arithmetic-Logic Units (ALUs), Application-Specific Integrated Circuits (ASICs), Floating Point Units (FPUs), input/output (I/O) elements, peripheral component interconnect (PCI) or peripheral component interconnect express (PCIe) elements, and/or the like.

The communication interface 1210 may include one or more receivers, transmitters, and/or transceivers that enable the computing device 1200 to communicate with other computing devices via an electronic communication network, included wired and/or wireless communications. The communication interface 1210 may include components and functionality to enable communication over any of a number of different networks, such as wireless networks (e.g., Wi-Fi, Z-Wave, Bluetooth, Bluetooth LE, ZigBee, etc.), wired networks (e.g., communicating over Ethernet or InfiniBand), low-power wide-area networks (e.g., LoRaWAN, SigFox, etc.), and/or the Internet. In one or more embodiments, logic unit(s) 1220 and/or communication interface 1210 may include one or more data processing units (DPUs) to transmit data received over a network and/or through interconnect system 1202 directly to (e.g., a memory of) one or more GPU(s) 1208.

The I/O ports 1212 may enable the computing device 1200 to be logically coupled to other devices including the I/O components 1214, the presentation component(s) 1218, and/or other components, some of which may be built in to (e.g., integrated in) the computing device 1200. Illustrative I/O components 1214 include a microphone, mouse, keyboard, joystick, game pad, game controller, satellite dish, scanner, printer, wireless device, etc. The I/O components 1214 may provide a natural user interface (NUI) that processes air gestures, voice, or other physiological inputs generated by a user. In some instances, inputs may be transmitted to an appropriate network element for further processing. An NUI may implement any combination of speech recognition, stylus recognition, facial recognition, biometric recognition, gesture recognition both on screen and adjacent to the screen, air gestures, head and eye tracking, and touch recognition (as described in more detail below) associated with a display of the computing device 1200. The computing device 1200 may be include depth cameras, such as stereoscopic camera systems, infrared camera systems, RGB camera systems, touchscreen technology, and combinations of these, for gesture detection and recognition. Additionally, the computing device 1200 may include accelerometers or gyroscopes (e.g., as part of an inertia measurement unit (IMU)) that enable detection of motion. In some examples, the output of the accelerometers or gyroscopes may be used by the computing device 1200 to render immersive augmented reality or virtual reality.

The power supply 1216 may include a hard-wired power supply, a battery power supply, or a combination thereof. The power supply 1216 may provide power to the computing device 1200 to enable the components of the computing device 1200 to operate.

The presentation component(s) 1218 may include a display (e.g., a monitor, a touch screen, a television screen, a heads-up-display (HUD), other display types, or a combination thereof), speakers, and/or other presentation components. The presentation component(s) 1218 may receive data from other components (e.g., the GPU(s) 1208, the CPU(s) 1206, DPUs, etc.), and output the data (e.g., as an image, video, sound, etc.).

Example Data Center

Figure 13:
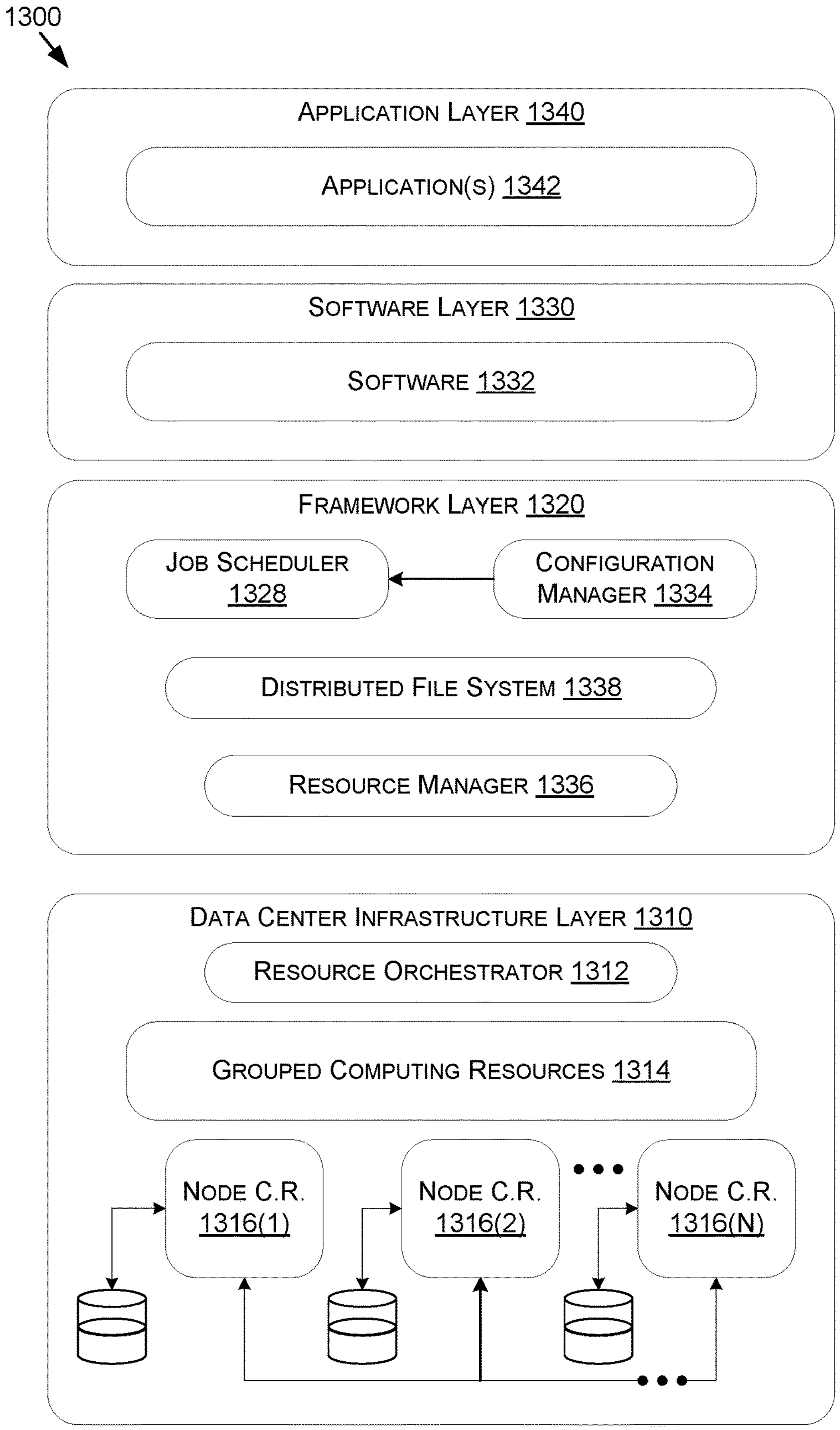
FIG. 13 is a block diagram of an example data center suitable for use in implementing some embodiments of the present disclosure.

FIG. 13 illustrates an example data center 1300 that may be used in at least one embodiments of the present disclosure. The data center 1300 may include a data center infrastructure layer 1310, a framework layer 1320, a software layer 1330, and/or an application layer 1340.

As shown in FIG. 13, the data center infrastructure layer 1310 may include a resource orchestrator 1312, grouped computing resources 1314, and node computing resources ("node C.R.s") 1316(1)-1316(N), where "N" represents any whole, positive integer. In at least one embodiment, node C.R.s 1316(1)-1316(N) may include, but are not limited to, any number of central processing units (CPUs) or other processors (including DPUs, accelerators, field programmable gate arrays (FPGAs), graphics processors or graphics processing units (GPUs), etc.), memory devices (e.g., dynamic read-only memory), storage devices (e.g., solid state or disk drives), network input/output (NW I/O) devices, network switches, virtual machines (VMs), power modules, and/or cooling modules, etc. In some embodiments, one or more node C.R.s from among node C.R.s 1316(1)-1316(N) may correspond to a server having one or more of the above-mentioned computing resources. In addition, in some embodiments, the node C.R.s 1316(1)-13161 (N) may include one or more virtual components, such as vGPUs, vCPUs, and/or the like, and/or one or more of the node C.R.s 1316(1)-1316(N) may correspond to a virtual machine (VM).

In at least one embodiment, grouped computing resources 1314 may include separate groupings of node C.R.s 1316 housed within one or more racks (not shown), or many racks housed in data centers at various geographical locations (also not shown). Separate groupings of node C.R.s 1316 within grouped computing resources 1314 may include grouped compute, network, memory or storage resources that may be configured or allocated to support one or more workloads. In at least one embodiment, several node C.R.s 1316 including CPUs, GPUs, DPUs, and/or other processors may be grouped within one or more racks to provide compute resources to support one or more workloads. The one or more racks may also include any number of power modules, cooling modules, and/or network switches, in any combination.

The resource orchestrator 1312 may configure or otherwise control one or more node C.R.s 1316(1)-1316(N) and/or grouped computing resources 1314. In at least one embodiment, resource orchestrator 1312 may include a software design infrastructure (SDI) management entity for the data center 1300. The resource orchestrator 1312 may include hardware, software, or some combination thereof.

In at least one embodiment, as shown in FIG. 13, framework layer 1320 may include a job scheduler 1328, a configuration manager 1334, a resource manager 1336, and/or a distributed file system 1338. The framework layer 1320 may include a framework to support software 1332 of software layer 1330 and/or one or more application(s) 1342 of application layer 1340. The software 1332 or application(s) 1342 may respectively include web-based service software or applications, such as those provided by Amazon Web Services, Google Cloud and Microsoft Azure. The framework layer 1320 may be, but is not limited to, a type of free and open-source software web application framework such as Apache Spark™ (hereinafter "Spark") that may utilize distributed file system 1338 for large-scale data processing (e.g., "big data"). In at least one embodiment, job scheduler 1328 may include a Spark driver to facilitate scheduling of workloads supported by various layers of data center 1300. The configuration manager 1334 may be capable of configuring different layers such as software layer 1330 and framework layer 1320 including Spark and distributed file system 1338 for supporting large-scale data processing. The resource manager 1336 may be capable of managing clustered or grouped computing resources mapped to or allocated for support of distributed file system 1338 and job scheduler 1328. In at least one embodiment, clustered or grouped computing resources may include grouped computing resource 1314 at data center infrastructure layer 1310. The resource manager 1336 may coordinate with resource orchestrator 1312 to manage these mapped or allocated computing resources.

In at least one embodiment, software 1332 included in software layer 1330 may include software used by at least portions of node C.R.s 1316(1)-1316(N), grouped computing resources 1314, and/or distributed file system 1338 of framework layer 1320. One or more types of software may include, but are not limited to, Internet web page search software, e-mail virus scan software, database software, and streaming video content software.

In at least one embodiment, application(s) 1342 included in application layer 1340 may include one or more types of applications used by at least portions of node C.R.s 1316 (1)-1316(N), grouped computing resources 1314, and/or distributed file system 1338 of framework layer 1320. One or more types of applications may include, but are not limited to, any number of a genomics application, a cognitive compute, and a machine learning application, including training or inferencing software, machine learning framework software (e.g., PyTorch, TensorFlow, Caffe, etc.), and/or other machine learning applications used in conjunction with one or more embodiments.

In at least one embodiment, any of configuration manager 1334, resource manager 1336, and resource orchestrator 1312 may implement any number and type of self-modifying actions based on any amount and type of data acquired in any technically feasible fashion. Self-modifying actions may relieve a data center operator of data center 1300 from making possibly bad configuration decisions and possibly avoiding underused and/or poor performing portions of a data center.

The data center 1300 may include tools, services, software or other resources to train one or more machine learning models or predict or infer information using one or more machine learning models according to one or more embodiments described herein. For example, a machine learning model(s) may be trained by calculating weight parameters according to a neural network architecture using software and/or computing resources described above with respect to the data center 1300. In at least one embodiment, trained or deployed machine learning models corresponding to one or more neural networks may be used to infer or predict information using resources described above with respect to the data center 1300 by using weight parameters calculated through one or more training techniques, such as but not limited to those described herein.

In at least one embodiment, the data center 1300 may use CPUs, application-specific integrated circuits (ASICs), GPUs, FPGAs, and/or other hardware (or virtual compute resources corresponding thereto) to perform training and/or inferencing using above-described resources. Moreover, one or more software and/or hardware resources described above may be configured as a service to allow users to train or performing inferencing of information, such as image recognition, speech recognition, or other artificial intelligence services.

Example Network Environments

Network environments suitable for use in implementing embodiments of the disclosure may include one or more client devices, servers, network attached storage (NAS), other backend devices, and/or other device types. The client devices, servers, and/or other device types (e.g., each device) may be implemented on one or more instances of the computing device(s) 1200 of FIG. 12—e.g., each device may include similar components, features, and/or functionality of the computing device(s) 1200. In addition, where backend devices (e.g., servers, NAS, etc.) are implemented, the backend devices may be included as part of a data center 1300, an example of which is described in more detail herein with respect to FIG. 13.

Components of a network environment may communicate with each other via a network(s), which may be wired, wireless, or both. The network may include multiple networks, or a network of networks. By way of example, the network may include one or more Wide Area Networks (WANs), one or more Local Area Networks (LANs), one or more public networks such as the Internet and/or a public switched telephone network (PSTN), and/or one or more private networks. Where the network includes a wireless telecommunications network, components such as a base station, a communications tower, or even access points (as well as other components) may provide wireless connectivity.

Compatible network environments may include one or more peer-to-peer network environments—in which case a server may not be included in a network environment—and one or more client-server network environments—in which case one or more servers may be included in a network environment. In peer-to-peer network environments, functionality described herein with respect to a server(s) may be implemented on any number of client devices.

In at least one embodiment, a network environment may include one or more cloud-based network environments, a distributed computing environment, a combination thereof, etc. A cloud-based network environment may include a framework layer, a job scheduler, a resource manager, and a distributed file system implemented on one or more of servers, which may include one or more core network servers and/or edge servers. A framework layer may include a framework to support software of a software layer and/or one or more application(s) of an application layer. The software or application(s) may respectively include web-based service software or applications. In embodiments, one or more of the client devices may use the web-based service software or applications (e.g., by accessing the service software and/or applications via one or more application programming interfaces (APIs)). The framework layer may be, but is not limited to, a type of free and open-source software web application framework such as that may use a distributed file system for large-scale data processing (e.g., "big data").

A cloud-based network environment may provide cloud computing and/or cloud storage that carries out any combination of computing and/or data storage functions described herein (or one or more portions thereof). Any of these various functions may be distributed over multiple locations from central or core servers (e.g., of one or more data centers that may be distributed across a state, a region, a country, the globe, etc.). If a connection to a user (e.g., a client device) is relatively close to an edge server(s), a core server(s) may designate at least a portion of the functionality to the edge server(s). A cloud-based network environment may be private (e.g., limited to a single organization), may be public (e.g., available to many organizations), and/or a combination thereof (e.g., a hybrid cloud environment).

The client device(s) may include at least some of the components, features, and functionality of the example computing device(s) 1200 described herein with respect to FIG. 12. By way of example and not limitation, a client device may be embodied as a Personal Computer (PC), a laptop computer, a mobile device, a smartphone, a tablet computer, a smart watch, a wearable computer, a Personal Digital Assistant (PDA), an MP3 player, a virtual reality headset, a Global Positioning System (GPS) or device, a video player, a video camera, a surveillance device or system, a vehicle, a boat, a flying vessel, a virtual machine, a drone, a robot, a handheld communications device, a hospital device, a gaming device or system, an entertainment system, a vehicle computer system, an embedded system controller, a remote control, an appliance, a consumer electronic device, a workstation, an edge device, any combination of these delineated devices, or any other suitable device.

The disclosure may be described in the general context of computer code or machine-useable instructions, including computer-executable instructions such as program modules, being executed by a computer or other machine, such as a personal data assistant or other handheld device. Generally, program modules including routines, programs, objects, components, data structures, etc., refer to code that perform particular tasks or implement particular abstract data types. The disclosure may be practiced in a variety of system configurations, including hand-held devices, consumer electronics, general-purpose computers, more specialty computing devices, etc. The disclosure may also be practiced in distributed computing environments where tasks are performed by remote-processing devices that are linked through a communications network.

As used herein, a recitation of "and/or" with respect to two or more elements should be interpreted to mean only one element, or a combination of elements. For example, "element A, element B, and/or element C" may include only element A, only element B, only element C, element A and element B, element A and element C, element B and element C, or elements A, B, and C. In addition, "at least one of element A or element B" may include at least one of element A, at least one of element B, or at least one of element A and at least one of element B. Further, "at least one of element A and element B" may include at least one of element A, at least one of element B, or at least one of element A and at least one of element B.

The subject matter of the present disclosure is described with specificity herein to meet statutory requirements. However, the description itself is not intended to limit the scope of this disclosure. Rather, the inventors have contemplated that the claimed subject matter might also be embodied in other ways, to include different steps or combinations of steps similar to the ones described in this document, in conjunction with other present or future technologies. Moreover, although the terms "step" and/or "block" may be used herein to connote different elements of methods employed, the terms should not be interpreted as implying any particular order among or between various steps herein disclosed unless and except when the order of individual steps is explicitly described.

Example Paragraphs

1. A method comprising: assigning index values to elements of a space to determine first assignments, the first assignments associating the elements with a first set of bins corresponding to the index values; determining, based at least on the first assignments, a subset of the elements corresponds to a same subregion of the space; based at least on the determining, assigning at least two of the index values to the subset of elements to determine second assignments, the second assignments associating the subset of elements with a second set of bins corresponding to the at least two of the index values; determining, based at least on the second assignments, one or more partitions of the subset of the elements; and assigning at least one of the elements to a node corresponding to a hierarchical partitioning of the elements.

2. The method of 1, wherein the assigning at least two of the index values to the subset of the elements is based at least on identifying, in the first assignments, that a same index value is assigned to at least two of the elements.

3. The method of any of 1-2, wherein the assigning at least two of the index values to the subset of the elements overwrites at least one of the first assignments with at least one of the second assignments in memory.

4. The method of any of 1-3, wherein the assigning at least two of the index values to the subset of the elements is based at least on determining a quantity of elements in the subset is greater than a threshold value.

5. The method of any of 1-4, wherein the first set of bins corresponds to a first grid of cells determined using the elements, and the second set of bins corresponds to a second grid of cells determined using the subset of elements.

6. The method of any of 1-5, wherein the determining a subset of the spatial elements correspond to a subregion of the space includes: sorting the first assignments to determine a sorted list of the first assignments; determining, using the sorted list of the first assignments, one or more split planes indicating a subrange of the sorted list that corresponds to the subset of the elements; and grouping the subset into the same subregion using the one or more split planes.

7. The method of any of 1-6, wherein the assigning at least two of the index values to the subset of the elements to determine the second assignments is based at least on determining the subset of the elements corresponds to a leaf node.

8. The method of any of 1-7, wherein the index values correspond to interleaved binary values of coordinates corresponding to regions of the space.

9. The method of any of 1-8, wherein the hierarchical partitioning of the elements includes a bounding volume hierarchy, and the elements include one or more of a primitive, a model, a mesh, a point, a voxel, a particle, a light source, an object, an emitter, or a sensor in a scene.

10. A system comprising: one or more processing units to perform operations including: assigning index values to elements of a space to determine first assignments, the first assignments associating the elements with a first set of bins corresponding to the index values; determining, based at least on the first assignments, at least two of the elements are assigned to a same index value; determining second assignments that associate the at least two of the elements to a second set of bins; and assigning, using the second assignments, at least one of the elements to a node corresponding to a partitioning of the second set of bins.

11. The system of 10, wherein the determining second assignments is based at least on assigning at least two of the index values to the at least two of the elements, the at least two of the index values corresponding to the second set of bins.

12. The system of any of 10-11, wherein the determining second assignments overwrites at least one of the first assignments with at least one of the second assignments in memory.

13. The system of any of 10-12, wherein the assigning of the index values includes a Z-order encoding of the elements using the index values.

14. The system of any of 10-13, wherein the first set of bins has a greater resolution than the second set of bins.

15. The system of any of 10-14, wherein the system is comprised in at least one of: a control system for an autonomous or semi-autonomous machine; a perception system for an autonomous or semi-autonomous machine; a system for performing simulation operations; a system for performing digital twin operations; a system for performing light transport simulation; a system for performing collaborative content creation for 3D assets; a system for performing deep learning operations; a system implementing one or more large language models (LLMs); a system implementing one or more vision language models (VLMs); a system implemented using an edge device a system implemented using a machine; a system for performing conversational AI operations; a system for generating synthetic data; a system incorporating one or more virtual machines (VMs); a system implemented at least partially in a data center; or a system implemented at least partially using cloud computing resources.

16. A processor comprising: one or more circuits to assign at least one element of a plurality of elements of a space to a partition based at least on: determining a subset of the elements corresponds to a same subregion of the space based at least on assignments of the plurality of elements to index values corresponding to a first set of bins; and based at least on the determining the subset corresponds to the same subregion of the space, at least two of the elements from the subset being assigned to a second set of bins to determine the partition.

17. The processor of 16, wherein the same subregion of the space corresponds to a bin of the first set of bins.

18. The processor of any of 16-17, the subset is determined to correspond to the same subregion of the space based at least on at least two of the elements in the subset being assigned a same index value from the index values.

19. The processor of any of 16-18, wherein the subset is determined to correspond to the same subregion based at least on: sorting the assignments to determine a sorted list of the assignments; determining, using the sorted list of the assignments, one or more split planes indicating a subrange of the sorted list of the assignments that corresponds to the subset of the elements; and grouping the subset into the same subregion using the one or more split planes.

20. The processor of any of 16-19, wherein the processor is comprised in at least one of: a control system for an autonomous or semi-autonomous machine; a perception system for an autonomous or semi-autonomous machine; a system for performing simulation operations; a system for performing digital twin operations; a system for performing light transport simulation; a system for performing collaborative content creation for 3D assets; a system for performing deep learning operations; a system implementing one or more large language models (LLMs); a system implementing one or more vision language models (VLMs); a system implemented using an edge device; a system implemented using a machine; a system for performing conversational AI operations; a system for generating synthetic data; a system incorporating one or more virtual machines (VMs); a system implemented at least partially in a data center; or a system implemented at least partially using cloud computing resources.

What is claimed is:

1. A method comprising:

assigning index values to elements of a space to determine first assignments of the elements to respective bins of a first set of bins corresponding to the index values;

determining, based at least on the first assignments, a subset of the elements corresponds to a same subregion of the space;

based at least on the determining, generating a spatial partitioning of the same subregion based at least on reassigning at least two of the index values to respective elements of the subset of elements to determine second assignments of the respective elements of the subset of elements to respective bins of a second set of bins that correspond to the at least two of the index values in the spatial partitioning;

determining, based at least on evaluating the spatial partitioning using the second assignments, one or more partitions of the subset of the elements; and assigning at least one of the elements to a node corresponding to a hierarchical partitioning of the elements.

2. The method of claim 1, wherein the reassigning is based at least on identifying, in the first assignments, that a same index value is assigned to at least two of the elements.

3. The method of claim 1, wherein the reassigning overwrites at least one of the first assignments with at least one of the second assignments in memory.

4. The method of claim 1, wherein the reassigning is based at least on determining a quantity of elements in the subset is greater than a threshold value.

5. The method of claim 1, wherein the first set of bins are of an initial spatial partitioning of the space that represents the space using a first grid of cells determined using the elements, and the second set of bins are of the spatial partitioning that represents the subregion as a second grid of cells determined using the subset of elements, the index values encoding a first coordinate space of the first grid and the at least two of the index values encoding a second coordinate space of the second grid.

6. The method of claim 1, wherein the determining the subset of the elements corresponds to the subregion of the space includes:

sorting the first assignments to determine a sorted list of the first assignments;

determining, using the sorted list of the first assignments, one or more split planes indicating a subrange of the sorted list that corresponds to the subset of the elements; and grouping the subset into the same subregion using the one or more split planes.

7. The method of claim 1, wherein the reassigning is based at least on determining the subset of the elements are assigned to a leaf node.

8. The method of claim 1, wherein the index values correspond to interleaved binary values of coordinates corresponding to regions of the space.

9. The method of claim 1, wherein the hierarchical partitioning of the elements includes a bounding volume hierarchy, and the elements include one or more of a primitive, a model, a mesh, a point, a voxel, a particle, a light source, an object, an emitter, or a sensor in a scene.

10. A system comprising:

one or more hardware processors to perform operations including:

assigning index values to elements of a space to determine first assignments of the elements to respective bins of a first set of bins corresponding to the index values;

determining, based at least on the first assignments, at least two of the elements are assigned to a same index value;

based at least on the at least two of the elements being assigned to the same index value, generating a spatial partitioning of a subregion of the space based at least on assigning different index values than the same index value to respective elements of the at least two of the elements to determine second assignments of the respective elements to respective bins of a second set of bins that correspond to the different index values in the spatial partitioning; and assigning, using the second assignments and the spatial partitioning, at least one of the elements to a node corresponding to a partitioning of the second set of bins.

11. The system of claim 10, wherein the different index values include one or more of the index values.

12. The system of claim 10, wherein the assigning of the different index values overwrites at least one of the first assignments with at least one of the second assignments in memory.

13. The system of claim 10, wherein the assigning of the index values includes a Z-order encoding of the elements using the index values.

14. The system of claim 10, wherein the spatial partitioning of the subregion has a lower resolution than an initial spatial partitioning of the space, the first assignments corresponding to the initial spatial partitioning.

15. The system of claim 10, wherein the system is comprised in at least one of:

a control system for an autonomous or semi-autonomous machine;

a perception system for an autonomous or semi-autonomous machine;

a system for performing simulation operations;

a system for performing digital twin operations;

a system for performing light transport simulation;

a system for performing collaborative content creation for 3D assets;

a system for performing deep learning operations;

a system implementing one or more large language models (LLMs);

a system implementing one or more vision language models (VLMs);

a system implemented using an edge device;

a system implemented using a machine;

a system for performing conversational AI operations;

a system for generating synthetic data;

a system incorporating one or more virtual machines (VMs);

a system implemented at least partially in a data center; or a system implemented at least partially using cloud computing resources.

16. At least one processor comprising:

one or more circuits to assign at least one element of a plurality of elements of a space to a partition based at least on:

determining a subset of the elements corresponds to a same subregion of the space based at least on first assignments of the plurality of elements to respective bins of a first set of bins using index values corresponding to the first set of bins; and based at least on the determining, generating a spatial partitioning of the same subregion based at least on reassigning at least two of the index values to respective elements of the subset to determine second assignments of the respective elements to respective bins of a second set of bins that correspond to the at least two of the index values in the spatial partitioning.

17. The at least one processor of claim 16, wherein the same subregion of the space corresponds to a bin of the first set of bins.

18. The at least one processor of claim 16, wherein the subset is determined to correspond to the same subregion of the space based at least on at least two of the elements in the subset being assigned a same index value from the index values.

19. The at least one processor of claim 16, wherein the subset is determined to correspond to the same subregion based at least on:

sorting the first assignments to determine a sorted list of the first assignments;

determining, using the sorted list of the first assignments, one or more split planes indicating a subrange of the sorted list of the first assignments that corresponds to the subset of the elements; and grouping the subset into the same subregion using the one or more split planes.

20. The at least one processor of claim 16, wherein the at least one processor is comprised in at least one of:

a control system for an autonomous or semi-autonomous machine;

a perception system for an autonomous or semi-autonomous machine;

a system for performing simulation operations;

a system for performing digital twin operations;

a system for performing light transport simulation;

a system for performing collaborative content creation for 3D assets;

a system for performing deep learning operations;

a system implementing one or more large language models (LLMs);

a system implementing one or more vision language models (VLMs);

a system implemented using an edge device;

a system implemented using a machine;

a system for performing conversational AI operations;

a system for generating synthetic data;

a system incorporating one or more virtual machines (VMs);

a system implemented at least partially in a data center; or a system implemented at least partially using cloud computing resources.

* * * * *